United States Patent
Chiu et al.

(10) Patent No.: US 11,251,328 B2
(45) Date of Patent: Feb. 15, 2022

(54) SEMICONDUCTOR LIGHT EMITTING DEVICE AND METHOD OF FABRICATING THE SAME

(71) Applicant: EPISTAR CORPORATION, Hsinchu (TW)

(72) Inventors: Hsin-Chih Chiu, Hsinchu (TW);
Chih-Chiang Lu, Hsinchu (TW);
Chun-Yu Lin, Hsinchu (TW);
Ching-Huai Ni, Hsinchu (TW);
Yi-Ming Chen, Hsinchu (TW);
Tzu-Chieh Hsu, Hsinchu (TW);
Ching-Pei Lin, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 16/871,303

(22) Filed: May 11, 2020

(65) Prior Publication Data

US 2020/0274022 A1 Aug. 27, 2020

Related U.S. Application Data

(60) Division of application No. 16/405,240, filed on May 7, 2019, now Pat. No. 10,651,335, which is a
(Continued)

(30) Foreign Application Priority Data

Nov. 12, 2012 (CN) .......................... 201210451045.1

(51) Int. Cl.
*H01L 33/00* (2010.01)
*H01L 33/46* (2010.01)
(Continued)

(52) U.S. Cl.
CPC .......... *H01L 33/0025* (2013.01); *H01L 21/00* (2013.01); *H01L 25/0753* (2013.01);
(Continued)

(58) Field of Classification Search
CPC ............. H01L 33/0025; H01L 33/0093; H01L 33/0062; H01L 33/46; H01L 33/387;
(Continued)

(56) References Cited

U.S. PATENT DOCUMENTS 5,606,572 A 2/1997 Swirhun et al.
6,956,241 B2 10/2005 Sugawara et al.
(Continued)

FOREIGN PATENT DOCUMENTS

CN 1848471 A 10/2006
CN 100350643 C 11/2007
(Continued)

OTHER PUBLICATIONS

Iwase et al., "Temperature-Controlled Transfer and Self-Wiring for Multi-Color Led Display on a Flexible Substrate," *2009 IEEE 22nd International Conference on Micro Electro Mechanical Systems*, Sorrento, 2009, pp. 176-179.

*Primary Examiner* — Karen Kusumakar
*Assistant Examiner* — Adam S Bowen
(74) *Attorney, Agent, or Firm* — Muncy, Geissler, Olds and Lowe, P.C.

(57) ABSTRACT

A semiconductor light-emitting device comprises a substrate; a first adhesive layer on the substrate; multiple epitaxial units on the first adhesive layer; a second adhesive layer on the multiple epitaxial units; multiple first electrodes between the first adhesive layer and the multiple epitaxial units, and contacting the first adhesive layer and the multiple epitaxial units; and multiple second electrodes between the second adhesive layer and the multiple epitaxial units, and
(Continued)

contacting the second adhesive layer and the multiple epitaxial units; wherein the multiple epitaxial units are totally separated.

19 Claims, 25 Drawing Sheets

Related U.S. Application Data continuation of application No. 15/643,807, filed on Jul. 7, 2017, now Pat. No. 10,283,669, which is a continuation of application No. 14/442,319, filed as application No. PCT/CN2013/078766 on Jul. 3, 2013, now Pat. No. 9,735,312.

(51) Int. Cl.
*H01L 33/38* (2010.01)
*H01L 33/62* (2010.01)
*H01L 33/22* (2010.01)
*H01L 25/075* (2006.01)
*H01L 21/00* (2006.01)

(52) U.S. Cl.
CPC ...... *H01L 33/0062* (2013.01); *H01L 33/0093* (2020.05); *H01L 33/22* (2013.01); *H01L 33/387* (2013.01); *H01L 33/46* (2013.01); *H01L 33/62* (2013.01); *H01L 33/0095* (2013.01); *H01L 33/382* (2013.01); *H01L 2924/0002* (2013.01)

(58) Field of Classification Search
CPC ......... H01L 33/62; H01L 21/00; H01L 33/22; H01L 25/0753; H01L 33/0095; H01L 33/382; H01L 33/20
See application file for complete search history.

(56) References Cited

U.S. PATENT DOCUMENTS

| | | | |
|---|---|---|---|
| 7,180,099 B2 | 2/2007 | Ogihara et al. | |
| 7,432,117 B2 | 10/2008 | Chu | |
| 2002/0079500 A1 | 6/2002 | Liu et al. | |
| 2004/0126911 A1* | 7/2004 | Kimura | H01L 24/95 |
| | | | 438/22 |
| 2004/0259331 A1* | 12/2004 | Ogihara | H01L 21/2007 |
| | | | 438/462 |
| 2009/0108286 A1 | 4/2009 | Lin et al. | |
| 2009/0114928 A1 | 5/2009 | Messere et al. | |
| 2009/0218941 A1 | 9/2009 | Nakamura et al. | |
| 2010/0001312 A1* | 1/2010 | Hsu | H01L 33/0093 |
| | | | 257/101 |
| 2010/0176410 A1* | 7/2010 | Furuyama | H01L 33/46 |
| | | | 257/98 |
| 2010/0283069 A1 | 11/2010 | Rogers et al. | |
| 2010/0317132 A1* | 12/2010 | Rogers | H01L 24/83 |
| | | | 438/27 |
| 2011/0003410 A1* | 1/2011 | Tsay | H01L 33/44 |
| | | | 438/27 |
| 2011/0151602 A1* | 6/2011 | Speier | H01L 33/0093 |
| | | | 438/26 |
| 2012/0241797 A1* | 9/2012 | Kim | H01L 33/62 |
| | | | 257/98 |

FOREIGN PATENT DOCUMENTS

| | | |
|---|---|---|
| CN | 101083253 A | 12/2007 |
| CN | 101345277 A | 1/2009 |
| CN | 102376826 A | 3/2012 |
| JP | 2002-246418 A | 8/2002 |
| JP | 2002314053 A | 10/2002 |
| JP | 2005-302889 A | 10/2005 |
| JP | 2005-347647 | 12/2005 |
| JP | 3748779 B2 | 2/2006 |
| JP | 2006319311 A | 11/2006 |
| JP | 2007-523472 A | 8/2007 |
| JP | 2004-106512 A | 4/2008 |
| JP | 2008-252069 | 10/2008 |
| JP | 2008252069 A | 10/2008 |
| JP | 2009-010204 A | 1/2009 |
| JP | 2010-087515 | 4/2010 |
| JP | 2010-114106 | 5/2010 |
| JP | 2010-177390 | 8/2010 |
| JP | 2010-283354 | 12/2010 |
| JP | 2012199405 A | 10/2012 |
| JP | 5162979 B2 | 3/2013 |
| JP | 2002-261335 A | 9/2013 |
| KR | 100999784 B1 | 12/2010 |
| KR | 2011-0000730 A | 1/2011 |
| TW | 200717884 A | 5/2007 |
| TW | 200742123 A | 11/2007 |
| TW | I335088 | 12/2010 |
| TW | 201205859 A | 2/2012 |
| TW | 201205859 A1 | 2/2012 |

\* cited by examiner

SEMICONDUCTOR LIGHT EMITTING DEVICE AND METHOD OF FABRICATING THE SAME

RELATED APPLICATION DATA

This present application is a divisional application of U.S. patent application Ser. No. 16/405,240, filed on May 7, 2019, which is a continuation application of U.S. patent application Ser. No. 15/643,807, filed on Jul. 7, 2017, which is a continuation application of U.S. patent application Ser. No. 14/442,319, filed on Feb. 19, 2016, which is national stage entry according to 35 U.S.C. § 371 of PCT Application No. PCT/CN2013/078766, Publication No. 2014/071745, filed on Jul. 3, 2013, and is incorporated herein by reference in its entirety.

TECHNICAL FIELD

The application is related to a method of fabricating a semiconductor light-emitting device, and especially is related to a fabricating method of forming two different semiconductor epitaxial stacks on a single substrate.

DESCRIPTION OF BACKGROUND ART

As the technology developing, the semiconductor light-emitting device has significantly contributed to information, communications, and energy conversion applications. For example, the semiconductor light-emitting device can be applied to fiber-optic communications, optical storage and military systems. For energy conversion applications, the semiconductor light-emitting device generally has three types: a device for converting electrical energy into light, such as light-emitting diode; a device for converting light signal into electrical signal, such as optical detector; and a device for converting light radiation energy into electrical energy, such as solar cell.

Growth substrate is very important for the semiconductor light-emitting device. Semiconductor epitaxial structure, which is necessary for forming the semiconductor light-emitting device, is formed on the growth substrate and is also supported by the growth substrate. Therefore, it is important to choose a suitable growth substrate for growing a high quality semiconductor epitaxial structure of the semiconductor light-emitting device.

However, a substrate suitable for growth is sometimes not suitable for support. In conventional process of fabricating the red light diode, GaAs substrate, which is opaque to red light, is used as the growth substrate, because the difference of the lattice constant between GaAs substrate and the semiconductor epitaxial structure of the red light device is the smallest. But, the opaque growth substrate reduces the light-emitting efficiency of the light device, as the light device is operated for emitting a light.

Since the growth substrate and the support substrate for the light device should meet different conditions, the technology of transferring substrate is developed. Namely, the semiconductor epitaxial structure grows on the growth substrate firstly, and then the semiconductor epitaxial structure is transferred to the support substrate for the following fabricating process. The steps of transferring the semiconductor epitaxial structure from the growth substrate to the support substrate include removing the growth substrate and bonding the semiconductor epitaxial structure and the support substrate, wherein removing the growth substrate is one of the key steps.

The method of removing the growth substrate from the semiconductor epitaxial structure includes dissolving the growth substrate by etchant, grinding the growth substrate, or forming a sacrificial layer between the growth substrate and the semiconductor epitaxial structure in advance and removing the sacrificial layer by etching process to separate the growth substrate and the semiconductor epitaxial structure. However, the growth substrate is going to be discarded no matter in the process of dissolving the growth substrate by etchant or the process of grinding the growth substrate. The growth substrate that cannot be reused means a waste in the environmentally-oriented era. So, for fabricating the semiconductor light-emitting device, if the growth substrate and the semiconductor epitaxial structure are separated by using the sacrificial layer, how to effectively implement the process of selectively transferring the semiconductor epitaxial structure is one of the research topics.

SUMMARY OF THE DISCLOSURE

A semiconductor light-emitting device comprises a substrate; a first adhesive layer on the substrate; multiple epitaxial units on the first adhesive layer; a second adhesive layer on the multiple epitaxial units; multiple first electrodes between the first adhesive layer and the multiple epitaxial units, and contacting the first adhesive layer and the multiple epitaxial units; and multiple second electrodes between the second adhesive layer and the multiple epitaxial units, and contacting the second adhesive layer and the multiple epitaxial units; wherein the multiple epitaxial units are totally separated.

A method for forming semiconductor light-emitting device comprises the steps of: providing a semiconductor epitaxial stack; forming multiple first electrodes on the semiconductor epitaxial stack; providing a substrate; adhering the semiconductor epitaxial stack to the substrate with a first adhesive layer; forming multiple second electrodes on the semiconductor epitaxial stack; forming a second adhesive layer on the semiconductor epitaxial stack; and dividing the semiconductor epitaxial stack to multiple epitaxial units; wherein each of the first electrodes contacts the first adhesive layer and corresponding one of the multiple epitaxial units, and each of the second electrodes contacts the second adhesive layer and corresponding one of the multiple epitaxial units.

DETAILED DESCRIPTION OF PREFERRED EMBODIMENTS

First Embodiment

FIGS. 1A to 1H show a method of manufacturing a semiconductor light-emitting device in accordance with an embodiment of the application.

Figure 1A:
FIG. 1A shows a side view of a semiconductor light-emitting device during the process in accordance with the first step of a manufacturing method of the first embodiment of the present application.

FIG. 1A shows a semiconductor epitaxial stack 110 including an n-type semiconductor layer 112, an active layer 114, and a p-type semiconductor layer 116 on a growth substrate 10. The n-type semiconductor layer 112, the active layer 114, and the p-type semiconductor layer 116 can be sequentially formed on the growth substrate 10 by conventional epitaxial growth process. In the embodiment, the material of the growth substrate 10 comprises GaAs, germanium (Ge), indium phosphide (InP), sapphire ($Al_2O_3$), silicon carbide (SiC), silicon (Si), lithium aluminum oxide ($LiAlO_2$), zinc oxide (ZnO), gallium nitride (GaN), or aluminum nitride (AlN). In the embodiment, the n-type semiconductor layer 112 can be aluminum gallium indium phosphide (AlGaInP) series material or other materials; the material of the p-type semiconductor layer 116 can be GaP or other materials; the material of the active layer 114 comprises aluminum gallium indium phosphide (AlGaInP) series material, aluminum gallium indium nitride (AlGaInN) series material or zinc oxide (ZnO) series material, and the structure of the active layer 114 comprises single heterostructure (SH), double heterostructure (DH), double-side double heterostructure (DDH), or multi-quantum well (MWQ) structure. Specifically, the active layer 114 can be made of intrinsic, p-type or, n-type semiconductor material. While an electrical current flows through the semiconductor epitaxial stack 110, the active layer 114 is able to emit a light. When the active layer 114 is made of aluminum gallium indium phosphide (AlGaInP) series material, the active layer 114 is able to emit an amber series of light, such as a red light, an orange light and a yellow light. When the active layer 114 is made of aluminum gallium indium nitride (AlGaInN) series material, the active layer 114 is able to emit a blue or a green light. Besides, the semiconductor epitaxial stack 110 can include more semiconductor layers with different functions.

Figure 1B:
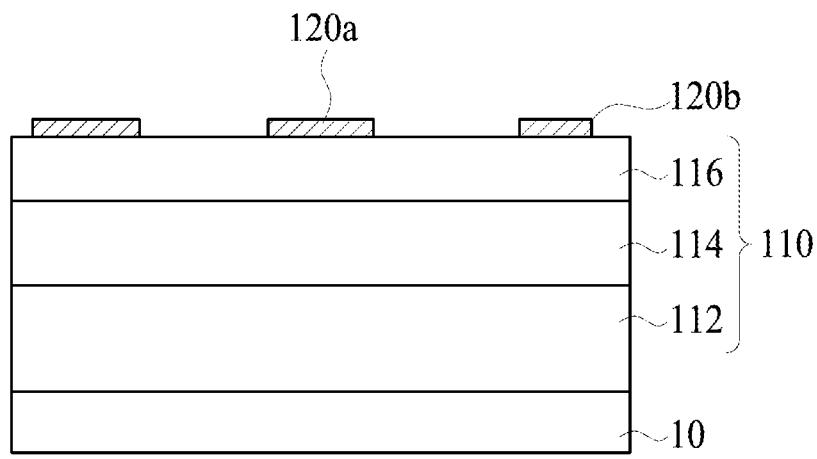
FIG. 1B shows a side view of a semiconductor light-emitting device during the process in accordance with the second step of a manufacturing method of the first embodiment of the present application.

FIG. 1B shows that the p-side electrodes 120a, 120b are patterned on the p-type semiconductor layer 116 by lithography process with sputtering, thermal deposition, or electroplating method. The material of the p-side electrodes 120a, 120b can be metal, such as Au, Ag, Cu, Al, Pt, Ni, Ti, Sn, and the alloy thereof or the stacking layers thereof.

Figure 1C:
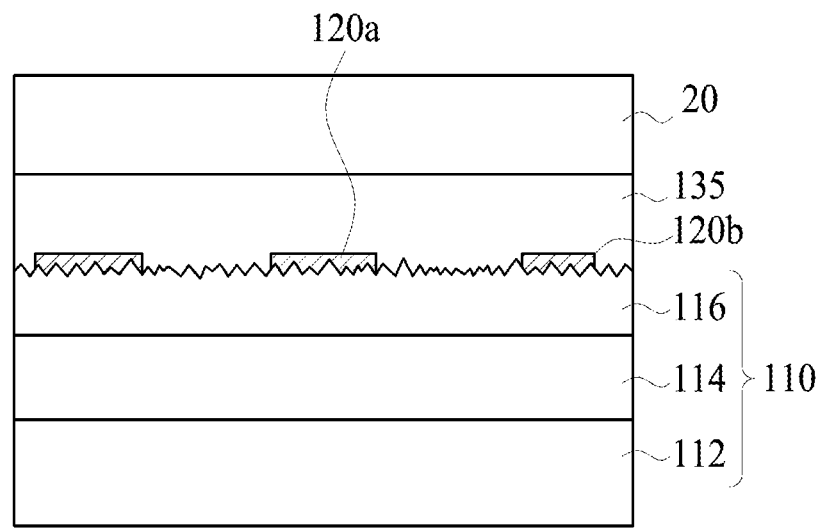
FIG. 1C shows a side view of a semiconductor light-emitting device during the process in accordance with the third step of a manufacturing method of the first embodiment of the present application.

As FIG. 1C shows, after forming the p-type semiconductor layer 116, a first support substrate 20 is prepared, and a first adhesive layer 135 is formed on the first support substrate 20 by spin coating or deposition. And, the semiconductor epitaxial stack 110 is adhered to the first support substrate 20 with the first adhesive layer 135. Then, the growth substrate 10 can be removed by wet etching or laser lift-off. The first support substrate 20 can be made from single material and can be composite substrate which is made from combination of different materials. For example, the first support substrate 20 can include a first substrate and a second substrate which is bonded with the first substrate (not shown). In the embodiment, the material of the support substrate 20 comprises inorganic material, such as sapphire ($Al_2O_3$), lithium aluminum oxide ($LiAlO_2$), zinc oxide (ZnO), gallium nitride (GaP), glass and aluminum nitride (AlN), or organic polymer material. As FIG. 1C shows, a transferring structure is formed by the semiconductor epitaxial stack 110 transferred to the first support substrate 20 and the first support substrate 20. In order to increase the light-emitting efficiency of the semiconductor light-emitting device made from the semiconductor epitaxial stack 110, a portion of the surface of the p-type semiconductor layer 116 can be roughened by wet etching or dry etching.

Figure 1D:
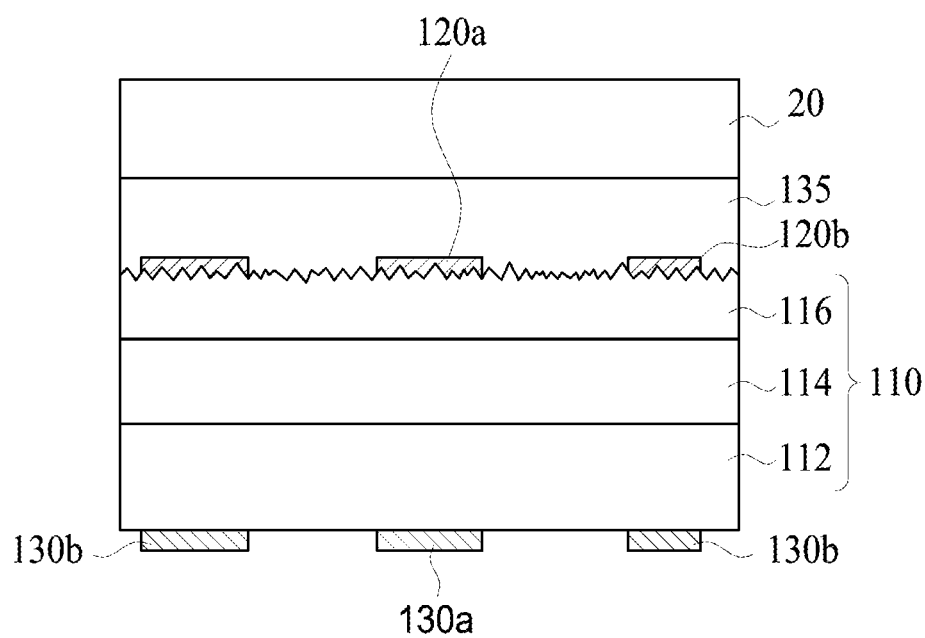
FIG. 1D shows a side view of a semiconductor light-emitting device during the process in accordance with the fourth step of a manufacturing method of the first embodiment of the present application.

After the semiconductor epitaxial stack 110 is transferred to the support substrate 20, the patterned n-side electrodes 130a, 130b are formed on the exposed surface of the n-type semiconductor layer 112 by lithography process with sputtering, thermal deposition, or electroplating as shown in FIG. 1D. The material of the n-side electrodes 130a, 130b can be metal, such as Au, Ag, Cu, Al, Pt, Ni, Ti, Sn, and the alloy thereof or the stacking layers thereof.

Figure 1E:
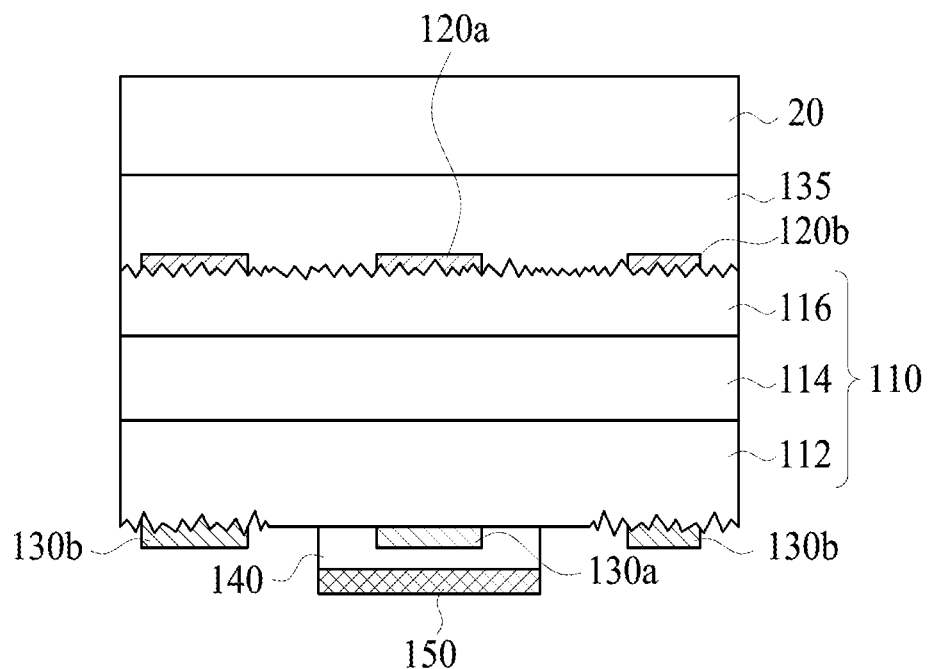
FIG. 1E shows a side view of a semiconductor light-emitting device during the process in accordance with the fifth step of a manufacturing method of the first embodiment of the present application.

FIG. 1E shows that, in order to fit different processes of fabricating different semiconductor light-emitting devices, the following processes on the n-side electrodes 130a, 130b can be the same or different. In the embodiment, a metal oxide transparent conductive layer 140 is formed on the surface of the semiconductor epitaxial stack 110 by CVD or PVD. Then, a reflective layer 150 is formed on a portion of the metal oxide transparent conductive layer 140. The material of the metal oxide transparent conductive layer 140 comprises ITO, IZO, InO, SnO, FTO, ATO, CTO, AZO, GZO or the combination thereof; the material of the reflective layer 150 comprises metal, such as Au, Ag, Cu, Cr, Al, Pt, Ni, Ti, Sn, Be or the alloy or the stacking layers thereof or Distributed Bragg Reflector (DBR), wherein DBR is made from the stacking layers comprising $Al_2O_3$, $SiO_2$, $TiO_2$ or MN. Then, a portion of the metal oxide transparent conductive layer 140, which is uncovered by the reflective layer 150, is removed, and the metal oxide transparent conductive layer 140 only clads the n-side electrode 130a.

Figure 1F:
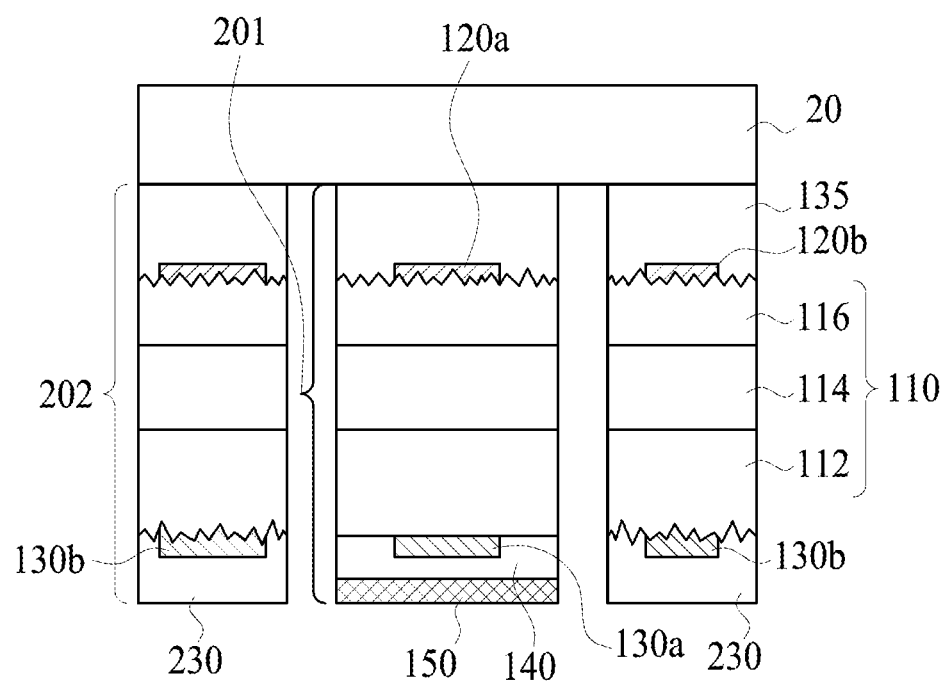
FIG. 1F shows a side view of a semiconductor light-emitting device during the process in accordance with the sixth step of a manufacturing method of the first embodiment of the present application.

FIG. 1F shows a side view of multiple first epitaxial units 201 and multiple second epitaxial units 202 above the first substrate 20 disclosed in the embodiment, which are totally divided by using dry etching in order to break off the electrical connection through the semiconductor epitaxial stack 110.

Figure 1G:
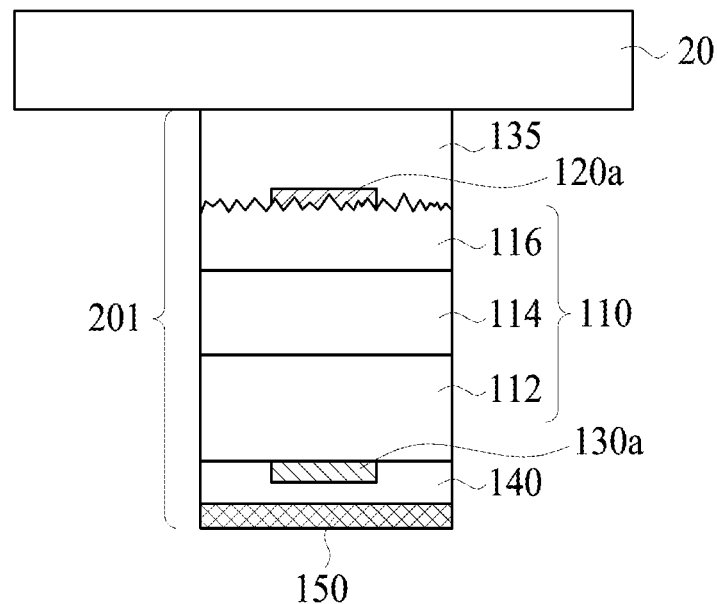
FIG. 1G shows a first side view of a semiconductor light-emitting device during the process in accordance with the seventh step of a manufacturing method of the first embodiment of the present application.
Figure 1H:
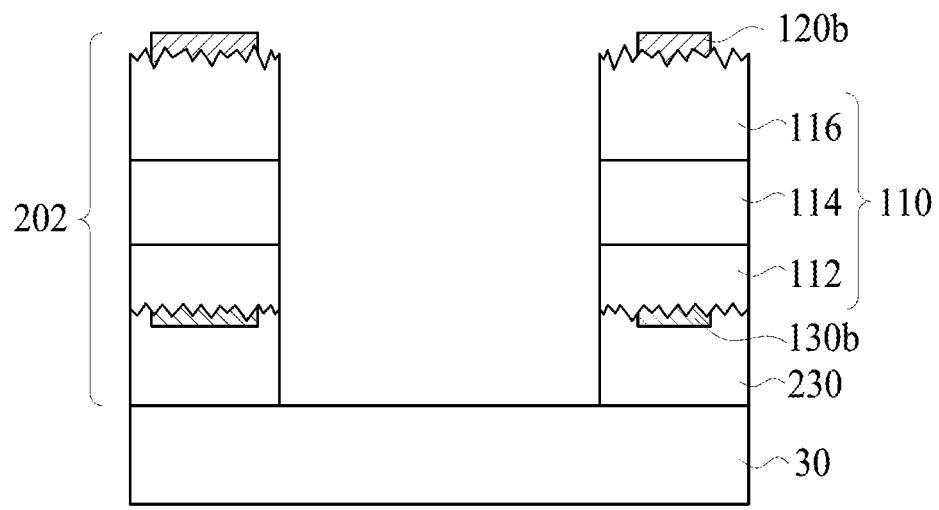
FIG. 1H shows a second side view of a semiconductor light-emitting device during the process in accordance with the seventh step of a manufacturing method of the first embodiment of the present application.

Specifically, the semiconductor epitaxial stack 110 is divided into the first epitaxial units 201 and the second epitaxial units 202 by forming a patterned photoresist layer (not shown) on the surface of the n-type semiconductor layer 112 and then using the dry etching, such as Inductively Coupled Plasma (ICP) and Plasma Etching (PE), to etch from the n-type semiconductor layer 112. In the embodiment, on the support substrate 20, the first epitaxial units 201 and the second epitaxial units 202 have different geometric shapes and areas, wherein each of the first epitaxial units 201 has the p-side electrode 120a and the n-side electrode 130a as shown in FIG. 1G, and each of the second epitaxial units 202 has the p-side electrode 120b and the n-side electrode 130b as shown in FIG. 1H.

Figure 7:
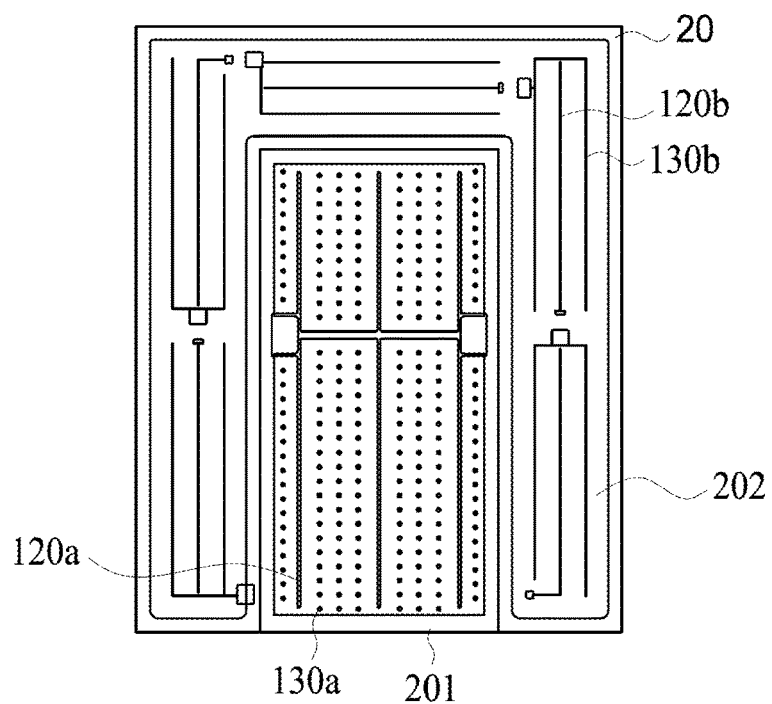
FIG. 7 shows a top view of the semiconductor light-emitting device during the process in accordance with the sixth step of the first embodiment of the present application.

Besides, as FIG. 7 shows, the second epitaxial unit 202 is about around the first epitaxial unit 201 from the top view. As FIG. 1F shows, in order to increase the light-emitting efficiency of the semiconductor light-emitting device, a portion of the surface of the n-type semiconductor layer 112 of the first epitaxial unit 201 or/and the second epitaxial unit 202 can be roughened by wet etching or dry etching. Then, a patterned second adhesive layer 230 is formed on a portion of the surface of the semiconductor epitaxial stack 110, which is corresponding to the position of the second epitaxial units 202, by spin coating or deposition through a patterned mask, such as patterned photoresist. The portion of the semiconductor epitaxial stack 110 corresponding to the second epitaxial units 202 is prepared for being transferred again.

Figure 3A:
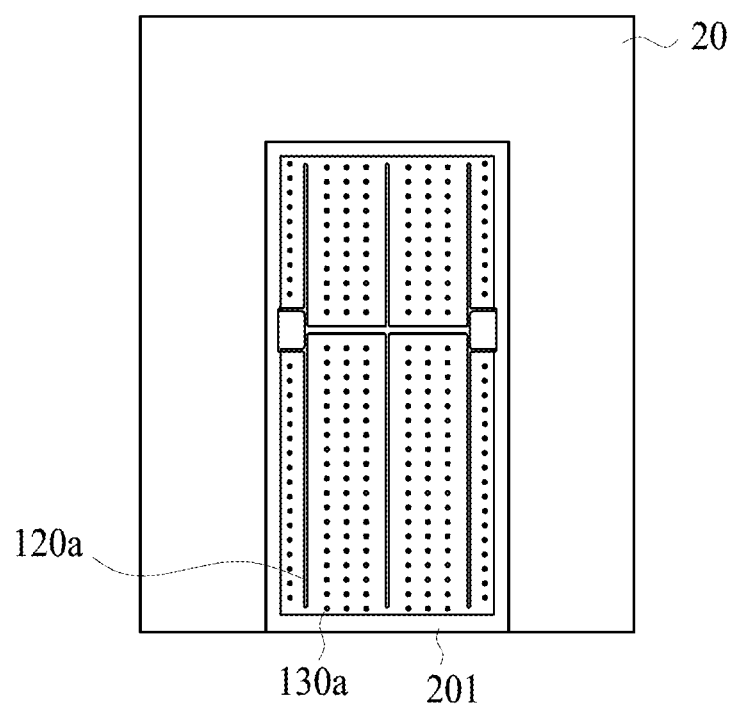
FIG. 3A shows a first top view of the semiconductor light-emitting device during the process in accordance with the seventh step of the first embodiment of the present application.

The next step is to prepare a second support substrate 30. The second support substrate 30 is adhered to the second epitaxial units 202 with the patterned second adhesive layer 230 by heating or pressing. Next, a laser is irradiated through the first support substrate 20 to dissolve the first adhesive layer 135 between the first support substrate 20 and the p-type semiconductor layer 116, and then the second epitaxial units 202 are transferred to the second support substrate 30. After the second epitaxial units 202 are adhered to the second support substrate 30, the remaining first adhesive layer 135 on the surface of the second epitaxial units 202 on the second support substrate 30 is removed by dry or wet etching. FIGS. 1G and 1H show the first support substrate 20 with the first epitaxial units 201 and the second support substrate 30 with the second epitaxial units 202, wherein the top views thereof are respectively shown in FIGS. 3A and 4A. In the embodiment, FIG. 4A show a top view of the second epitaxial units 202, wherein the second epitaxial units 202 are arranged in a U-shape. In the following process, the first support substrate 20 and one of the first epitaxial units 201 are formed as a semiconductor light-emitting device 200, and the second support substrate 30 and the second epitaxial units 202 are formed as a semiconductor light-emitting device 300, wherein the top views thereof are respectively shown in FIGS. 3C and 4C.

In the embodiment, as the above mentioned, the second epitaxial units 202 and the first support substrate 20 are separated by the laser to dissolve the first adhesive layer 135. Besides, a material which has low adhesion with the first support substrate 20, such as $SiO_2$, can be used as the first adhesive layer 135. The second epitaxial units 202 can be separated from the first support substrate 20 by physical mechanical force after the second epitaxial units 202 are selectively adhered to the second substrate 30 through the patterned second adhesive layer 230.

Second Embodiment

FIGS. 2A to 2H show a method of manufacturing a semiconductor light-emitting device in accordance with another embodiment of present application.

Figure 2A:
FIG. 2A shows a side view of a semiconductor light-emitting device during the process in accordance with the first step of a manufacturing method of the second embodiment of the present application.

FIG. 2A shows a semiconductor epitaxial stack 2110 including an n-type semiconductor layer 2112, an active layer 2114, and a p-type semiconductor layer 2116 on a growth substrate 210. The n-type semiconductor layer 2112, the active layer 2114, and the p-type semiconductor layer 2116 can be sequentially formed on the growth substrate 210 by conventional epitaxial growth process. In the embodiment, the material of the growth substrate 210 comprises GaAs, germanium (Ge), indium phosphide (InP), sapphire, ($Al_2O_3$), silicon carbide (SiC), silicon (Si), lithium aluminum oxide ($LiAlO_2$), zinc oxide (ZnO), gallium nitride (GaN) or aluminum nitride (AlN). In the embodiment, the n-type semiconductor layer 2112 can be aluminum gallium indium phosphide (AlGaInP) series material or other materials; the material of the p-type semiconductor layer 2116 can be GaP or other materials; the material of the active layer 2114 comprises aluminum gallium indium phosphide (AlGaInP) series material, aluminum gallium indium nitride (AlGaInN) series material or zinc oxide (ZnO) series material, and the structure of the active layer 2114 comprises single heterostructure (SH), double heterostructure (DH), double-side double heterostructure (DDH), or multi-quantum well (MWQ) structure. Specifically, the active layer 2114 can be made of intrinsic, p-type, or n-type semiconductor material. While an electrical current flows through the semiconductor epitaxial stack 2110, the active layer 2114 is able to emit a light. When the active layer 2114 is made of aluminum gallium indium phosphide (AlGaInP) series material, the active layer 2114 is able to emit an amber series of light, such as a red light, an orange light, and a yellow light. When the active layer 2114 is made of aluminum gallium indium nitride (AlGaInN) series material, the active layer 2114 is able to emit a blue or a green light. Besides, the semiconductor epitaxial stack 2110 can include more semiconductor layers with different functions.

Figure 2B:
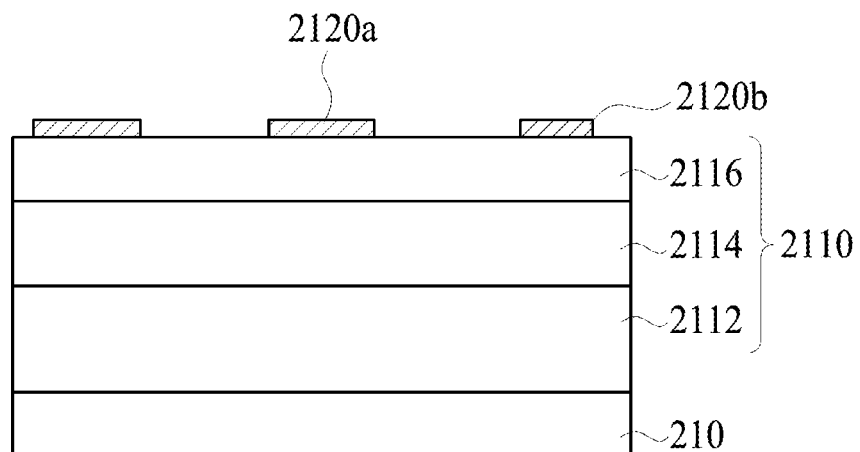
FIG. 2B shows a side view of a semiconductor light-emitting device during the process in accordance with the second step of a manufacturing method of the second embodiment of the present application.

FIG. 2B shows that the p-side electrodes 2120a, 2120b are patterned on the p-type semiconductor layer 2116 by lithography process with sputtering, thermal deposition, or electroplating. The material of the p-side electrodes 2120a, 2120b can be metal, such as Au, Ag, Cu, Al, Pt, Ni, Ti, Sn, and the alloy thereof or the stacking layers thereof.

Figure 2C:
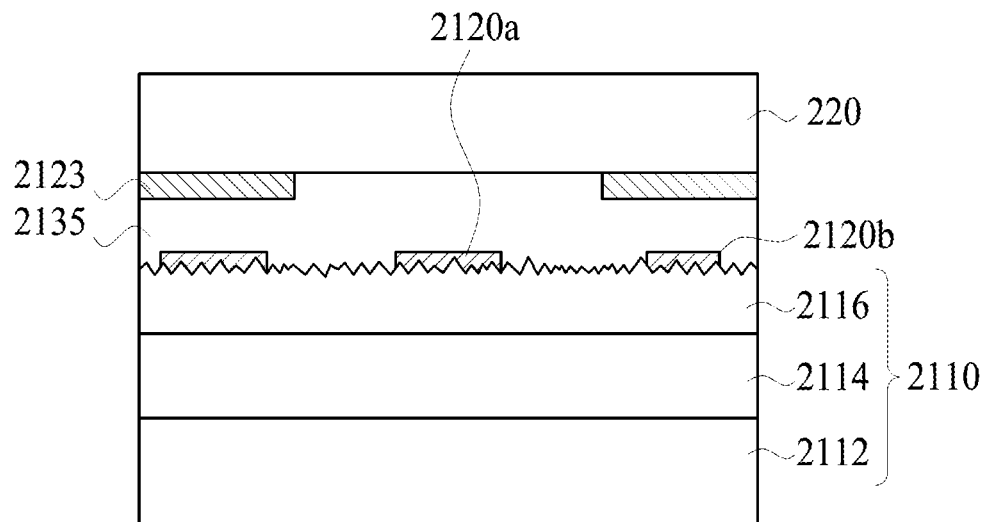
FIG. 2C shows a side view of a semiconductor light-emitting device during the process in accordance with the third step of a manufacturing method of the second embodiment of the present application.

As FIG. 2C shows, after the p-side electrodes 2120a, 2120b are formed, a support substrate 220 is provided, and a patterned sacrificial layer 2123 is formed on a surface of the support substrate 220 by lithography process. The position of the patterned sacrificial layer 2123 is corresponding to multiple second epitaxial units which are prepared to be transferred in the later step. Next, a first adhesive layer 2135 is formed by spin coating or deposition. The semiconductor epitaxial stack 2110 is adhered to the first support substrate 220 by the first adhesive layer 2135. The first adhesive layer 2135 can be coated on the surface of the first support substrate 220 for covering the patterned sacrificial layer 2123. In other way, the first adhesive layer 2135 can also be coated on the surface of the p-type semiconductor layer 2116 and cover the p-side electrodes 2120a, 2120b. Then, the semiconductor epitaxial stack 2110 and the first support substrate 220 are bonded by heating and/or pressing. Finally, the growth substrate 210 is removed by wet etching or laser lift-off to form the structure shown in FIG. 2C.

The first support substrate 220 is not limited to a single material and can be composite substrate which is made from combination of different materials. For example, the first support substrate 220 can include a first substrate and a second substrate which is bonded with the first substrate (not shown). In the embodiment, the material of the support substrate 220 comprises inorganic material, such as sapphire (Al$_2$O$_3$), lithium aluminum oxide (LiAlO$_2$), zinc oxide (ZnO), gallium nitride (GaP), glass and aluminum nitride (AlN), or organic polymer material. As FIG. 2C shows, in order to increase the light-emitting efficiency of the semiconductor light-emitting device made from the semiconductor epitaxial stack 2110, a portion of the surface of the p-type semiconductor layer 2116 can be roughened by wet etching or dry etching.

Figure 2D:
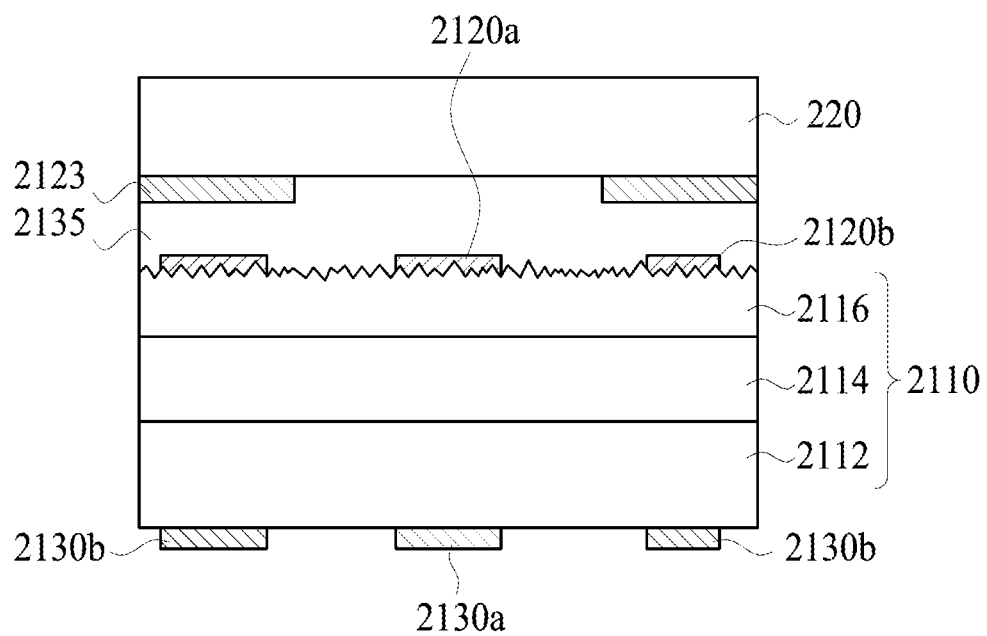
FIG. 2D shows a side view of a semiconductor light-emitting device during the process in accordance with the fourth step of a manufacturing method of the second embodiment of the present application.

After the semiconductor epitaxial stack 2110 is transferred to the support substrate 220, the patterned n-side electrodes 2130a, 2130b are formed on the exposed surface of the n-type semiconductor layer 2112 by lithography process with sputtering, thermal deposition, or electroplating as shown in FIG. 2D. The material of the n-side electrodes 2130a, 2130b can be metal, such as Au, Ag, Cu, Al, Pt, Ni, Ti, Sn, and the alloy thereof or the stacking layers thereof.

Figure 2E:
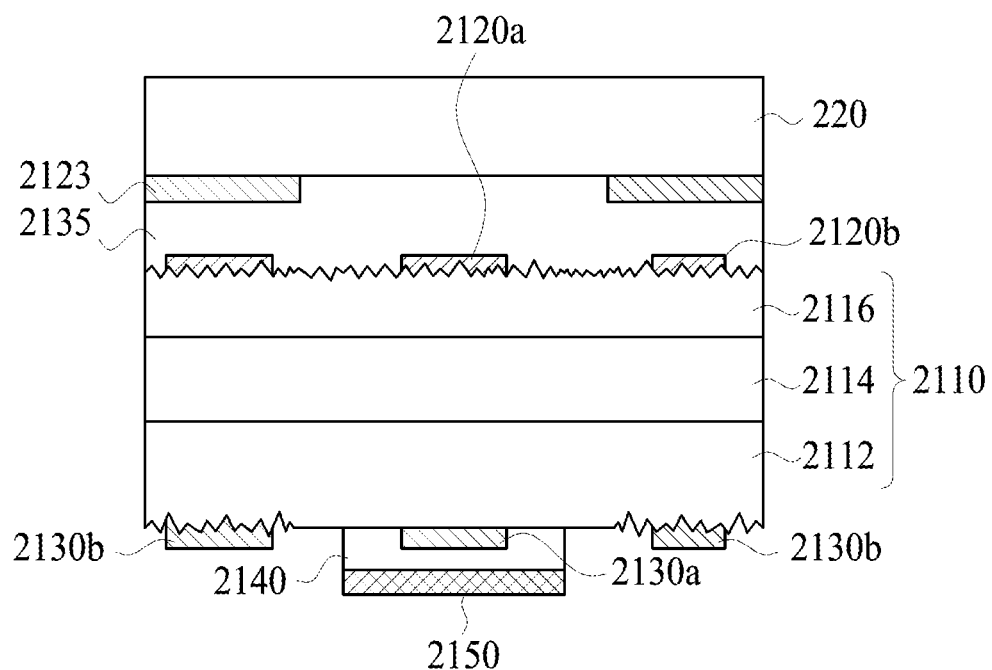
FIG. 2E shows a side view of a semiconductor light-emitting device during the process in accordance with the fifth step of a manufacturing method of the second embodiment of the present application.

FIG. 2E shows that, in order to fit different processes of fabricating different semiconductor light-emitting devices, the following processes on the n-side electrodes 2130a, 2130b can be the same or different. In the embodiment, on the surface of the semiconductor epitaxial stack 2110, a metal oxide transparent conductive layer 2140 and/or a reflective layer 2150 can be formed on the surface of the n-type semiconductor layer 2112 by CVD or PVD. The material of the metal oxide transparent conductive layer 2140 comprises ITO, IZO, InO, SnO, FTO, ATO, CTO, AZO, GZO, or the combination thereof; the material of the reflective layer 2150 comprises metal, such as Au, Ag, Cu, Cr, Al, Pt, Ni, Ti, Sn, Be, or the alloy or the stacking layers thereof.

Figure 2F:
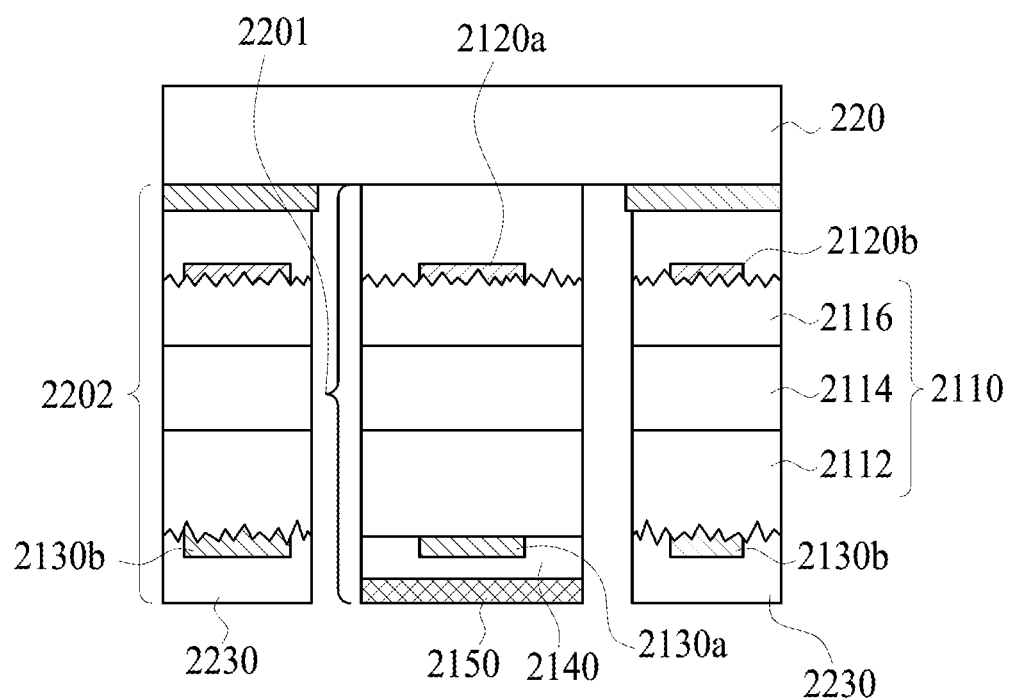
FIG. 2F shows a side view of a semiconductor light-emitting device during the process in accordance with the sixth step of a manufacturing method of the second embodiment of the present application.

FIG. 2F shows a side view of multiple first epitaxial units 2201 and multiple second epitaxial units 2202 above the first substrate 220 disclosed in the embodiment, which are divided by dry etching. And, the first adhesive layer 2135 and the patterned sacrificial layer 2123 are also divided.

Specifically, the semiconductor epitaxial stack 2110 is divided into the first epitaxial units 2201 and the second epitaxial units 2202 by forming a patterned photoresist layer (not shown) on the surface of the n-type semiconductor layer 2112 and then the dry etching, such as Inductively Coupled Plasma (ICP) and Plasma Etching (PE), to etch from the n-type semiconductor layer 2112. In the embodiment, on the support substrate 220, the first epitaxial units 2201 and the second epitaxial units 2202 have different geometric shapes and areas, wherein each of the first epitaxial units 2201 has the p-side electrode 2120a and the n-side electrode 2130a, and each of the second epitaxial units 2202 has the p-side electrode 2120b and the n-side electrode 2130b.

As FIG. 2F shows, in order to increase the light-emitting efficiency of the semiconductor light-emitting device, a portion of the surface of the n-type semiconductor layer 2112 of the first epitaxial unit 2201 or/and the second epitaxial unit 2202 can be roughened by wet etching or dry etching. Then, a patterned second adhesive layer 2230 is formed on a portion of the surface of the semiconductor epitaxial stack 2110 prepared for being transferred again, which is corresponding to the portion of the surface of the n-type semiconductor layer 2112 of the second epitaxial units 2202, by spin coating or deposition through a patterned mask, such as patterned photoresist.

In the embodiment, the material of the patterned second adhesive layer 2230 comprises organic material, such as Acrylic acid, Unsaturated polyester, Epoxy, Oxetane, Vinyl ether, Nylon, PP, PBT, PPO, PC, ABS, and PVC; metal, such as Ti, Au, Be, W, Al, Ge, Cu, and the alloy thereof; oxide, such as ITO, CTO, ATO, IZO, AZO, ZTO, ZnO, and SiO$_x$; or nitride, such as SiN$_x$.

The next step is to prepare a second support substrate 230. The second epitaxial units 2202 are adhered on the second support substrate 230 with the patterned second adhesive layer 2230 by heating or pressing. After the patterned sacrificial layer 2123 is removed or the adhesion of the patterned sacrificing layer 2123 is decreased by wet etching, dry etching, mechanical force separating, illuminating UV, or heating, the second epitaxial units 2202 are transferred to the second support substrate 230.

Figure 2G:
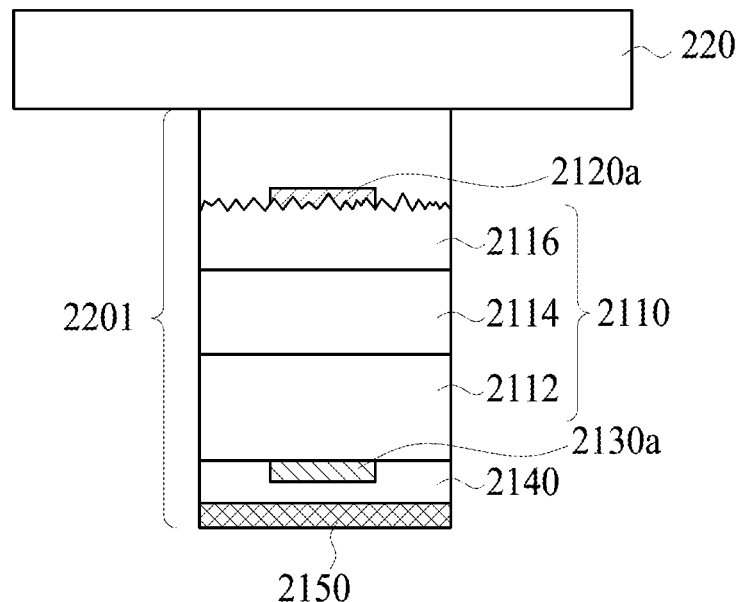
FIG. 2G shows a first side view of a semiconductor light-emitting device during the process in accordance with the seventh step of a manufacturing method of the second embodiment of the present application.
Figure 2H:
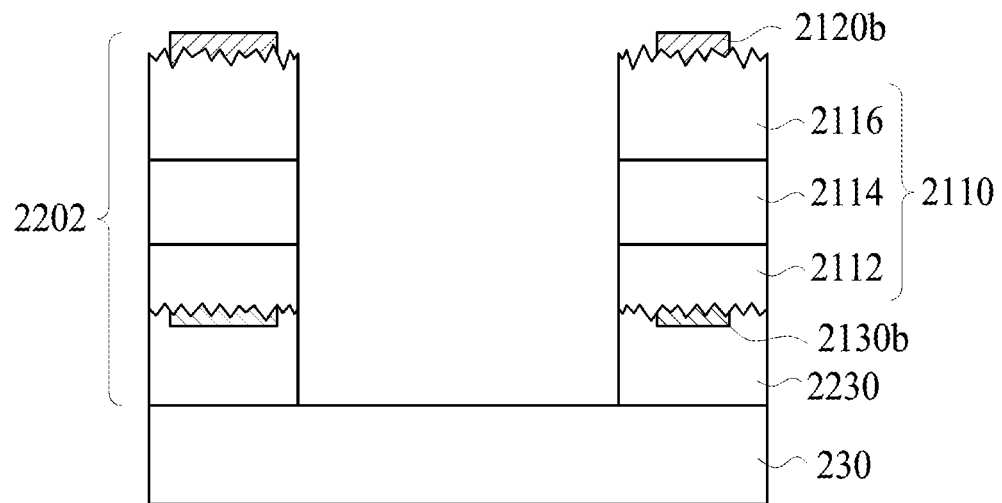
FIG. 2H shows a second side view of a semiconductor light-emitting device during the process in accordance with the fifth step of a manufacturing method of the second embodiment of the present application.

Finally, the remaining first adhesive layer 2135 and/or the remaining patterned sacrificial layer 2123 on the surface of the second epitaxial units 2202 on the second support substrate 230 is removed by dry etching or wet etching. FIGS. 2G and 2H show the first support substrate 220 with the first epitaxial units 2201 and the second support substrate 230 with the second epitaxial units 2202, wherein the top views thereof are respectively shown in FIGS. 3A and 4A. In the following process, the first support substrate 220 and one of the first epitaxial units 2201 are formed as a semiconductor light-emitting device 200, and the second support substrate 230 and the second epitaxial units 2202 are formed as a semiconductor light-emitting device 300, wherein the top views thereof are respectively shown in FIGS. 3C and 4C.

In the embodiment, the material of the patterned sacrificial layer 2123 comprises metal, such as Ti, Au, Ag, W, Al, Cr, Cu, Pt, and the combination thereof; UV dissociating glue; or dielectric material, such as SiO$_x$ and SiN$_x$. As mentioned above, the patterned sacrificial layer 2123 can be removed by wet etching, dry etching or illuminating UV, or the adhesion between the patterned sacrificial layer 2123 and the first support substrate 220 can be decreased by heating, and then the second epitaxial unit 2202 and the first support substrate 220 is separated by mechanical force separating.

Figure 3B:
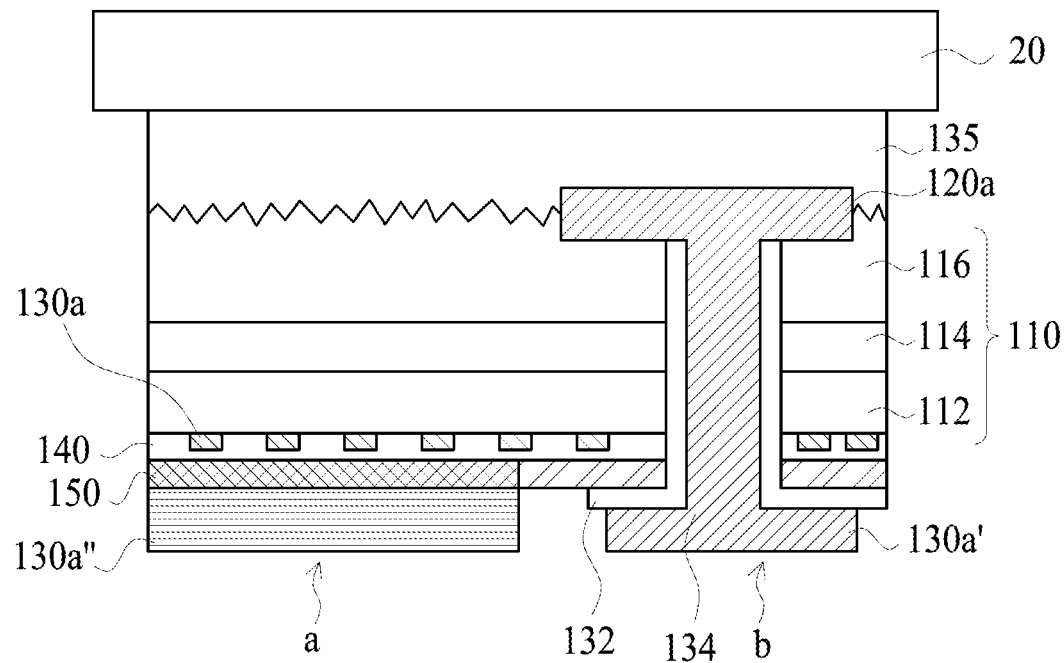
FIG. 3B shows a side view of the semiconductor light-emitting device during the process in accordance with the eighth step of the first embodiment of the present application.
Figure 3C:
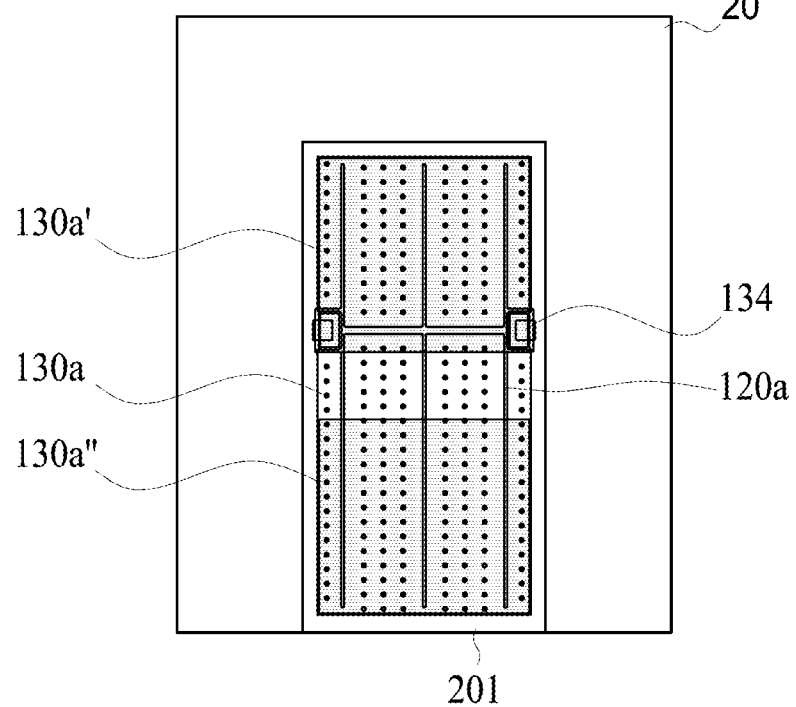
FIG. 3C shows a top view of the semiconductor light-emitting device during the process in accordance with the eighth step of the first embodiment of the present application.
Figure 4A:
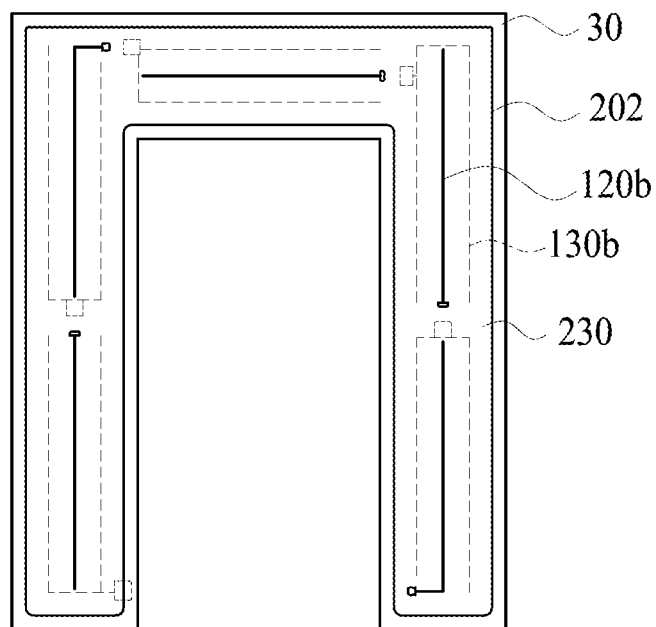
FIG. 4A shows a second top view of the semiconductor light-emitting device during the process in accordance with the seventh step of the first embodiment of the present application.

In the above embodiment, the side view and the top view of the semiconductor light-emitting device 200, which can be a flip-chip light-emitting device, are respectively shown in FIGS. 3B and 3C. As shown in FIG. 3B, in order to form two extensions 130a' and 130a'' by dry etching, such as Reactive Ion Etching (RIE), Inductively Coupled Plasma (ICP), and Plasma Etching (PE), and through a patterned mask, such as patterned photoresist (not shown), a conductive through hole 134 is formed by etching the semiconductor epitaxial stack 110(2110) along a direction perpendicular to the surface of the first support substrate 20 from the n-type semiconductor layer 112(2112) to the p-side electrode 120a (2120a). An insulative layer 132 is formed on the side wall of the conductive through hole 134 by CVD or PVD to electrically insulate from the semiconductor epitaxial stack 110(2110), and then a metal conductive structure is formed in the conductive through hole 134 to form a p-type extension 130a' which extends to the surface of the n-type semiconductor layer 112(2112). The p-type extension 130a' and the n-type extension 130a'' on the n-side electrodes 130a(2130a) are formed at the same step and are able to constitute the two extensional electrodes of the flip-chip type semiconductor light-emitting device 200. In another embodiment, when the flip-chip type semiconductor light-emitting device 200 electrically connects to the external electrical component, such as printed circuit board, the surface a of the n-type extension 130a'' and the surface b of the p-type extension 130a' on the same side of the first epitaxial unit 201 can be designed to be in the same high level for forming a more reliable and more stable connecting structure.

Figure 4B:
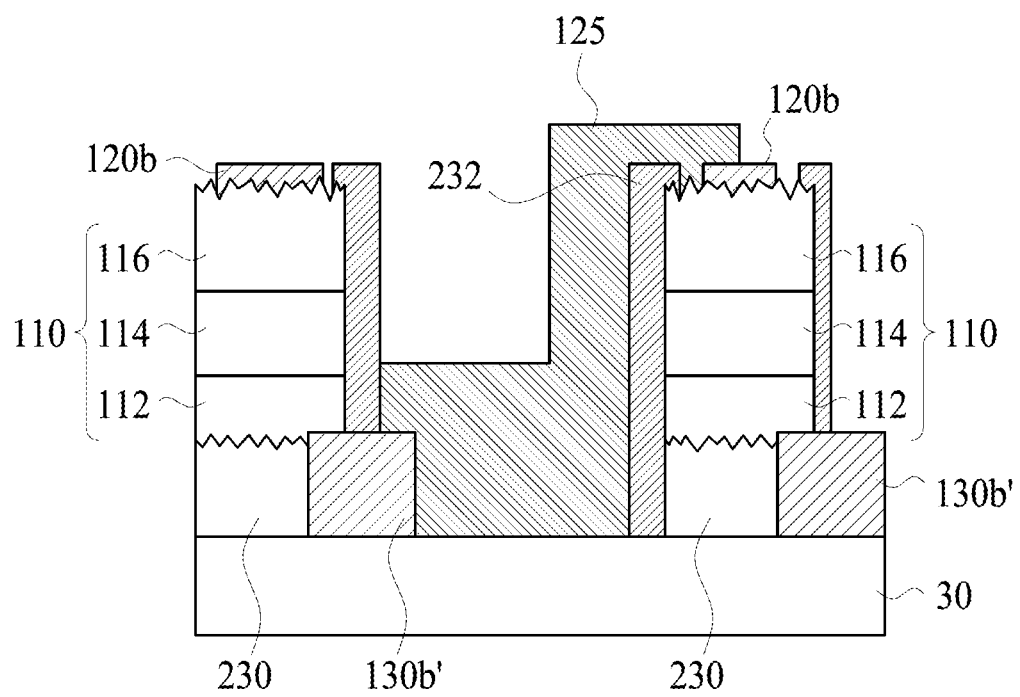
FIG. 4B shows a side view of the second semiconductor light-emitting device during the process in accordance with the eighth step of the first embodiment of the present application.
Figure 4C:
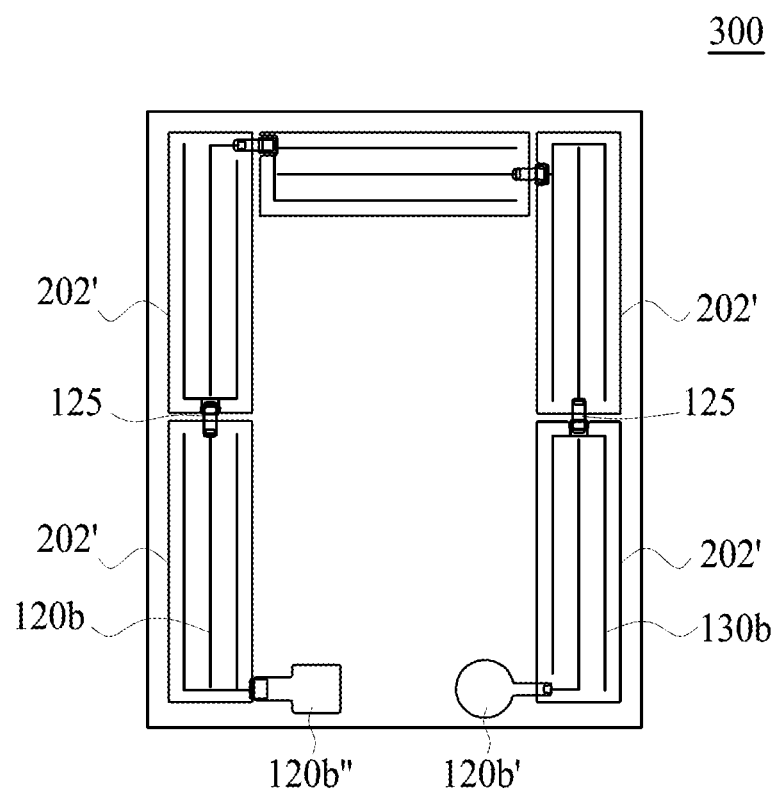
FIG. 4C shows a top view of the second semiconductor light-emitting device during the process in accordance with the eighth step of the first embodiment of the present application.

In the aforementioned embodiment, FIGS. 4B and 4C respectively show the side view and the top view of the semiconductor light-emitting device 300, which is a high-voltage single chip LED device, being transferred to the second support substrate 30. In order to clearly present the process of producing the semiconductor light-emitting device 300, the process steps and the structure are shown in FIGS. 4A, 5A, 5B, 4B and 4C.

As shown in FIG. 4A, the second epitaxial unit 202(2202) is transferred to the second substrate 30(230), wherein the p-side electrodes 120b(2120b) are directly formed on the p-type semiconductor layer 116(2116) after the semiconductor epitaxial stack 110 is formed on the growth substrate 10(210), and the n-side electrodes 130b(2130b) are directly formed on the n-type semiconductor layer 112(2112) after the first substrate transferring process. Therefore, the n-side electrodes 130b(2130b) are buried under the n-type semiconductor layer 112(2112) (indicated by dotted line) after the second epitaxial unit 202(2202) is transferred to the second support substrate 30(230). In the meantime, the second epitaxial unit 202(2202) has the p-side electrodes 120b(2120b) on the surface thereof, and the patterned second adhesive layer 230(2230) covers the second epitaxial unit 202(2202) and the surface of the p-side electrodes 120b(2120b).

Figure 5A:
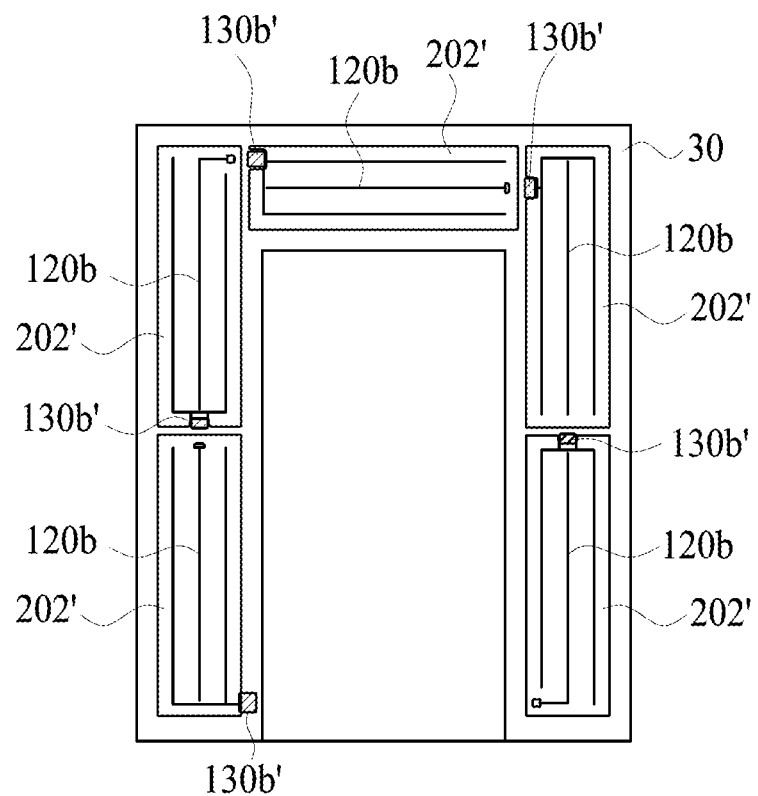
FIG. 5A shows a top view of the high-voltage semiconductor light-emitting device during the process in accordance with the first step of the first embodiment of the present application.
Figure 5B:
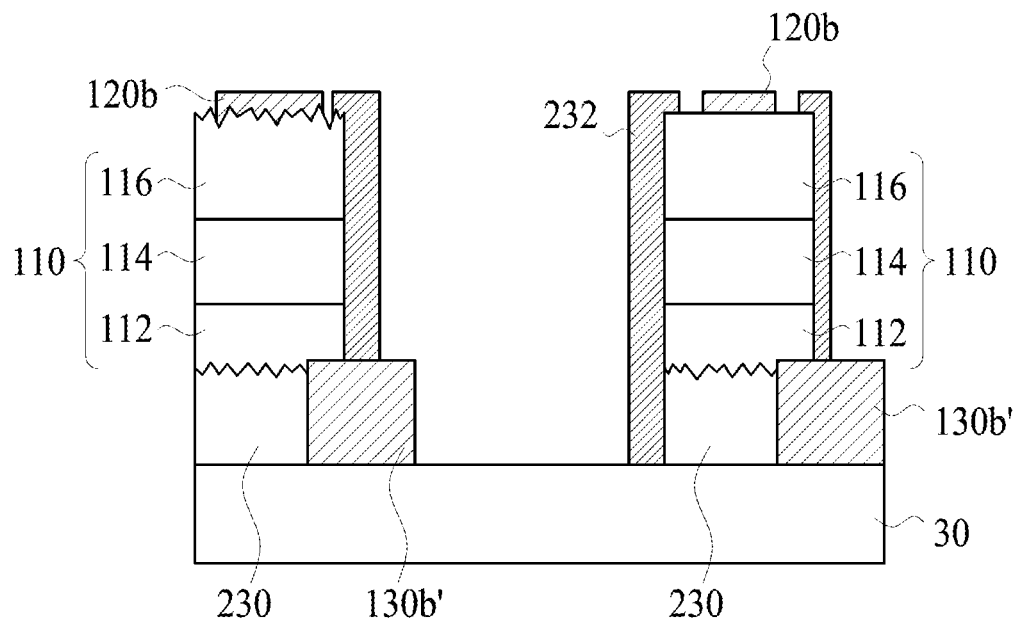
FIG. 5B shows a side view of the high-voltage semiconductor light-emitting device during the process in accordance with the first step of the first embodiment of the present application.

As shown in FIG. 5A, after the patterned second adhesive layer 230(2230) on the second epitaxial units 202(2202) and the surface of the p-side electrodes 120b(2120b) is removed, the second epitaxial unit 202(2202) is divided into multiple third epitaxial units 202' by dry etching, such as Reactive Ion Etching (RIE), Inductively Coupled Plasma (ICP), and Plasma Etching (PE). In the meantime, a portion of each of the n-side electrodes 130b' (shown by oblique lines) under the third epitaxial units 202' is exposed. Then, an insulative layer 232 is patterned and formed on a portion of the surface of each of the third epitaxial units 202' and the side wall between the neighboring third epitaxial units 202' by PVD or CVD and patterning process. FIG. 5B shows a side view of the two neighboring third epitaxial units 202' during the process. In the embodiment, the material of the insulative layer 232 is $SiO_2$. Besides $SiO_2$, the material of the insulative layer 232 comprises $SiN_x$, $Al_2O_3$, MN or the combination thereof.

Next, a metal conductive connection structure 125 is formed between the neighboring third epitaxial units 202' by lithography process to electrically connect the n-side electrode 130b' of one of the third epitaxial units 202' and the p-side electrode 120b of the other one in an electrical series connection to form a high-voltage single chip semiconductor light-emitting device 300 shown in FIGS. 4B and 4C. In the semiconductor light-emitting device 300, the p-side electrode 120b(2120b) and the n-side electrode 130b' are respectively on the opposite sides of the third epitaxial units 202'. The p-side electrode 120b(2120b) and the n-side electrode 130b' of the two of the third epitaxial units 202' at the ends of the semiconductor light-emitting device 300 are respectively connected to a p-type electrode pad 102b' and an n-type electrode pad 120b", wherein the p-side electrodes 120b(2120b), the n-side electrodes 130b', the p-type electrode pad 102b' and the n-type electrode pad 120b" can be formed with the metal conductive connection structure 125 in the same step. As shown in FIG. 4C, in the embodiment, the p-type electrode pad 102b' and the n-type electrode pad 120b" are formed on the surface of the second support substrate 30(230) beyond the third epitaxial units 202' and do not overlap with the surface of the third epitaxial units 202' for increasing the light extracting efficiency of the semiconductor light-emitting device 300.

For a skilled person in the art, besides the series structure, the third epitaxial units 202' can also be connected to an electrical parallel structure between the neighboring third epitaxial units 202'. Besides forming the metal conductive connection structure 125 between the third epitaxial units 202', the method of electrically connecting the third epitaxial units 202' further comprises forming a patterned electrically conductive structure on the surface of the second support substrate 30(230), and then bonding each of the third epitaxial units 202' in flip-chip type on the second support substrate 30(230) and electrically connecting to the patterned electrically conductive structure. Through the patterned electrically conductive structure, the third epitaxial units 202' can also be connected in series or parallel to form the semiconductor light-emitting device.

Figure 6A:
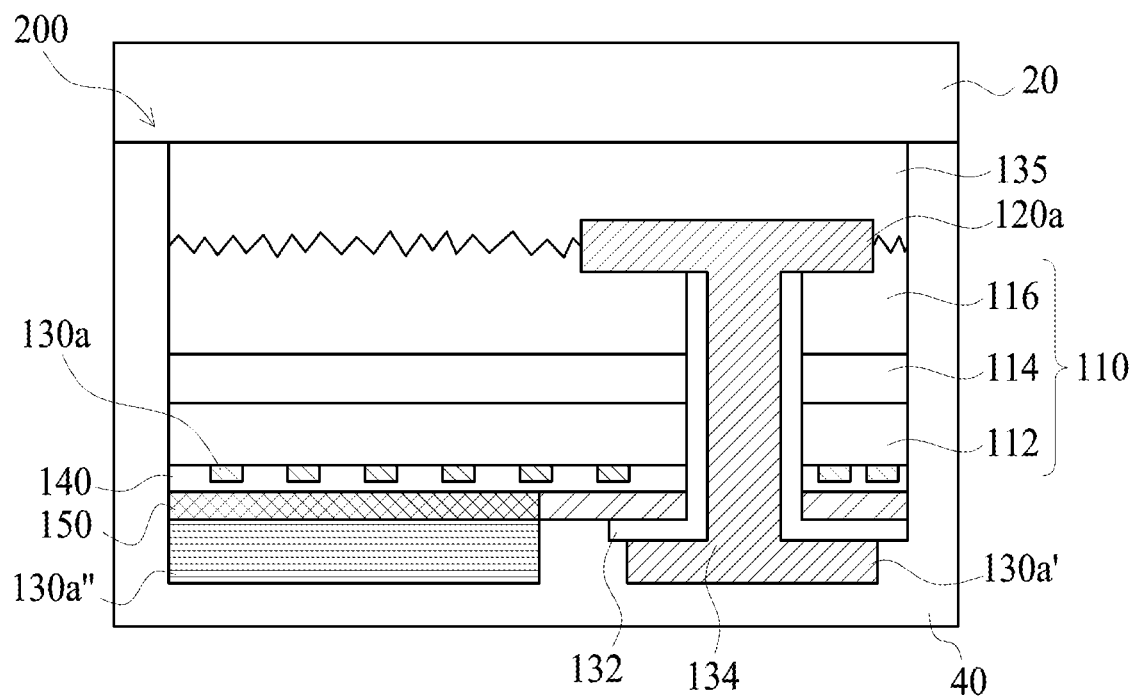
FIG. 6A shows a side view of the encapsulated semiconductor light-emitting device during the process in accordance with the first step of the third embodiment of the present application.
Figure 6B:
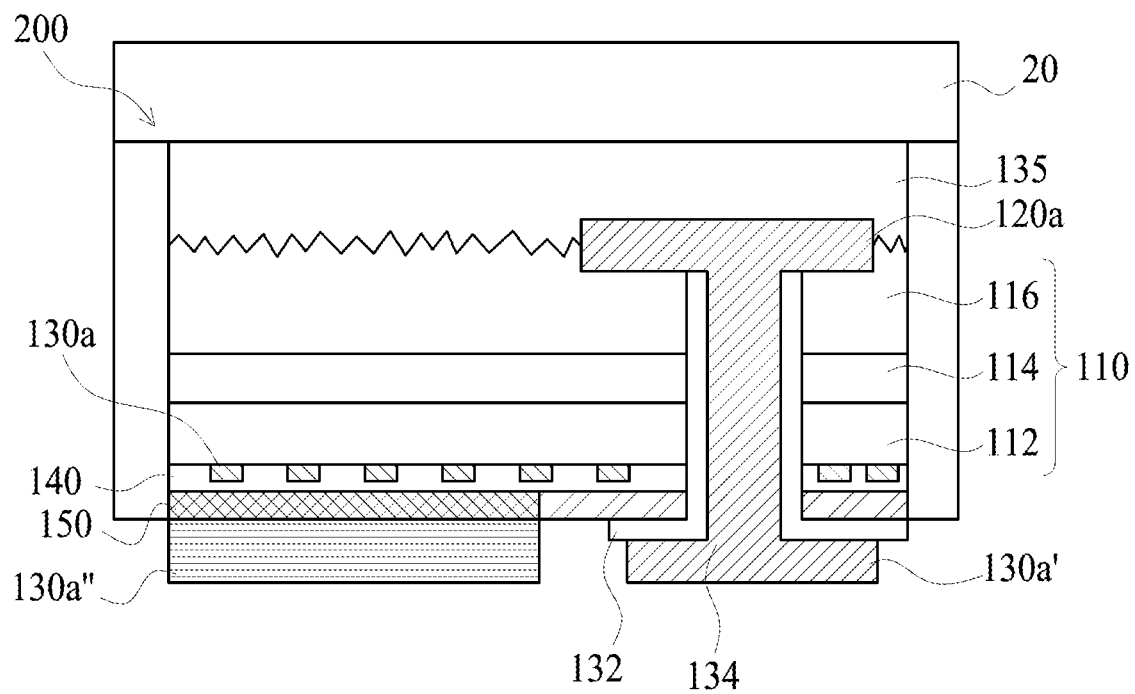
FIG. 6B shows a side view of the encapsulated semiconductor light-emitting device during the process in accordance with the second step of the third embodiment of the present application.
Figure 6C:
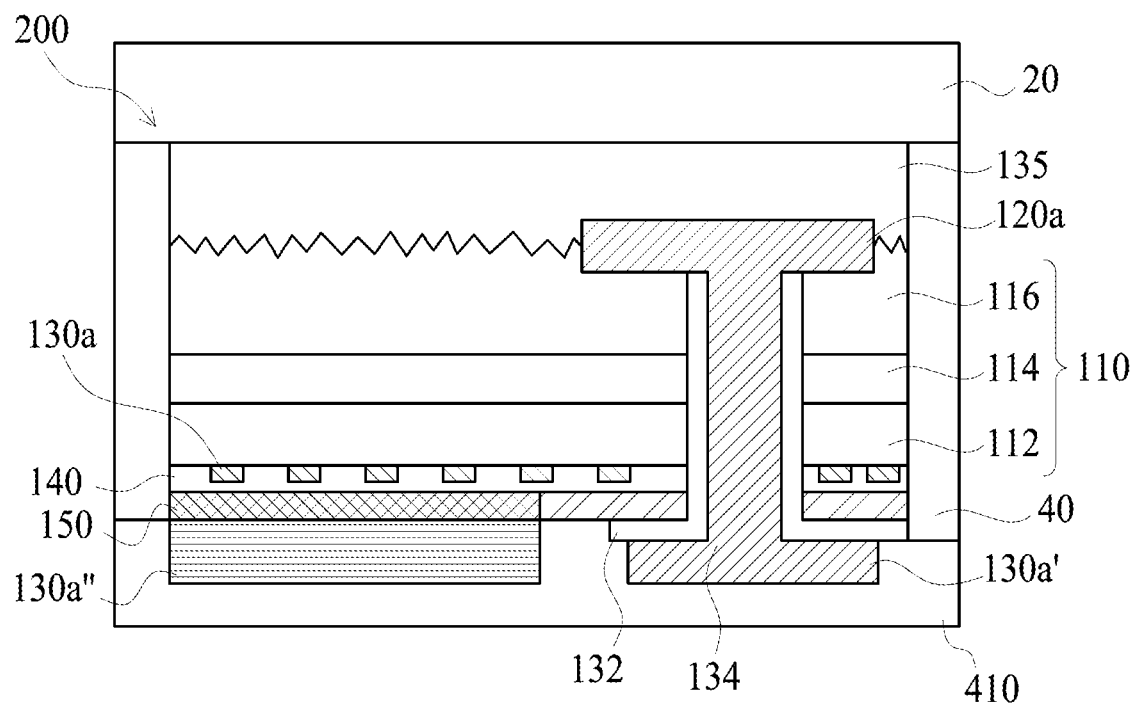
FIG. 6C shows a side view of the encapsulated semiconductor light-emitting device during the process in accordance with the third step of the third embodiment of the present application.
Figure 6D:
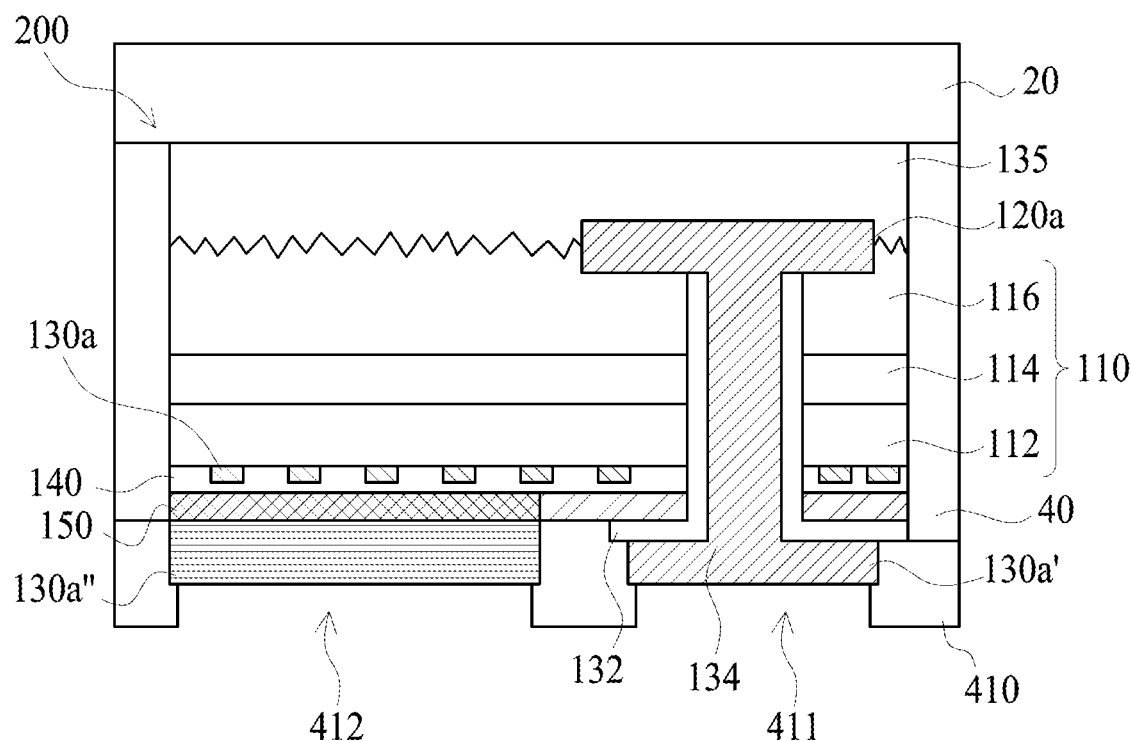
FIG. 6D shows a side view of the encapsulated semiconductor light-emitting device during the process in accordance with the fourth step of the third embodiment of the present application.

In the other embodiment, the semiconductor light-emitting device 200 can be produced as an encapsulated semiconductor light-emitting device 400 by subsequent processes, and the side view and the top view are respectively shown in FIGS. 6C and 6D. FIGS. 6A to 6C show the process and the structure of manufacturing the semiconductor light-emitting device 400 for clearly presenting the encapsulated semiconductor light-emitting device 400.

FIG. 6A shows a transparent structure 40 covering and surrounding the semiconductor light-emitting device 200 and the side wall of each of the epitaxial units thereof by spin coating and deposition, wherein the transparent structure 40 is transparent to the light emitted from the semiconductor light-emitting device 200, and the transparent structure 40 is used to encapsulate the semiconductor light-emitting device 200 for increasing the mechanical strength the semiconductor light-emitting device 200, disclosed in the embodiment. The material of the transparent structure 40 comprises Epoxy, Polyimide, Benzocyclobutene, Perfluorocyclobutane, SU8 photoresist, Acrylic Resin, Polymethylmethacrylate, Poly ethylene terephthalate, Polycarbonate, Polyetherimide, Fluorocarbon Polymer, Glass, $Al_2O_3$, SINR, SOG, Teflon, or the combination thereof.

FIG. 6B shows that a portion of the transparent structure 40 is removed to expose the p-type extension 130a' and the n-type extension 130a". As shown in FIG. 6C, an insulative scattering layer 410 is formed to cover the surface of the transparent structure 40 and a portion of the surface and side surface of the p-type extensions 130a' and the n-type extension 130a" by spin coating, deposition, stencil printing, or screen printing. The insulative scattering layer 410 can be used to scatter and reflect light and insulate against electrical current so the use of scattering material, reflective material, and insulative material can be reduced. In that case, it further prevents the materials from being damaged caused by different material characteristics, such as the difference of thermal expansion coefficients and the mechanical strengths so the yield rate can be increased, the cost can be reduced, and the moisture can be prevented from entering the semiconductor light-emitting device 200. The material of the insulative scattering layer 410 comprises Epoxy, $SiO_x$, $Al_2O_3$, $TiO_2$, Silicone, Resin, or the combination thereof.

Next, a portion of the insulative scattering layer 410, which is corresponding to the position of the p-type extensions 130a' and the n-type extension 130a", is removed by lithography process to form openings 411, 412 corresponding to the position of the p-type extensions 130a' and the n-type extension 130a". As shown in FIG. 6D, in the step, the insulative scattering layer 410 covers the side wall and a portion surface of the p-type extensions 130a' and the n-type extension 130a" in order to increase the light extracting efficiency.

Figure 6E:
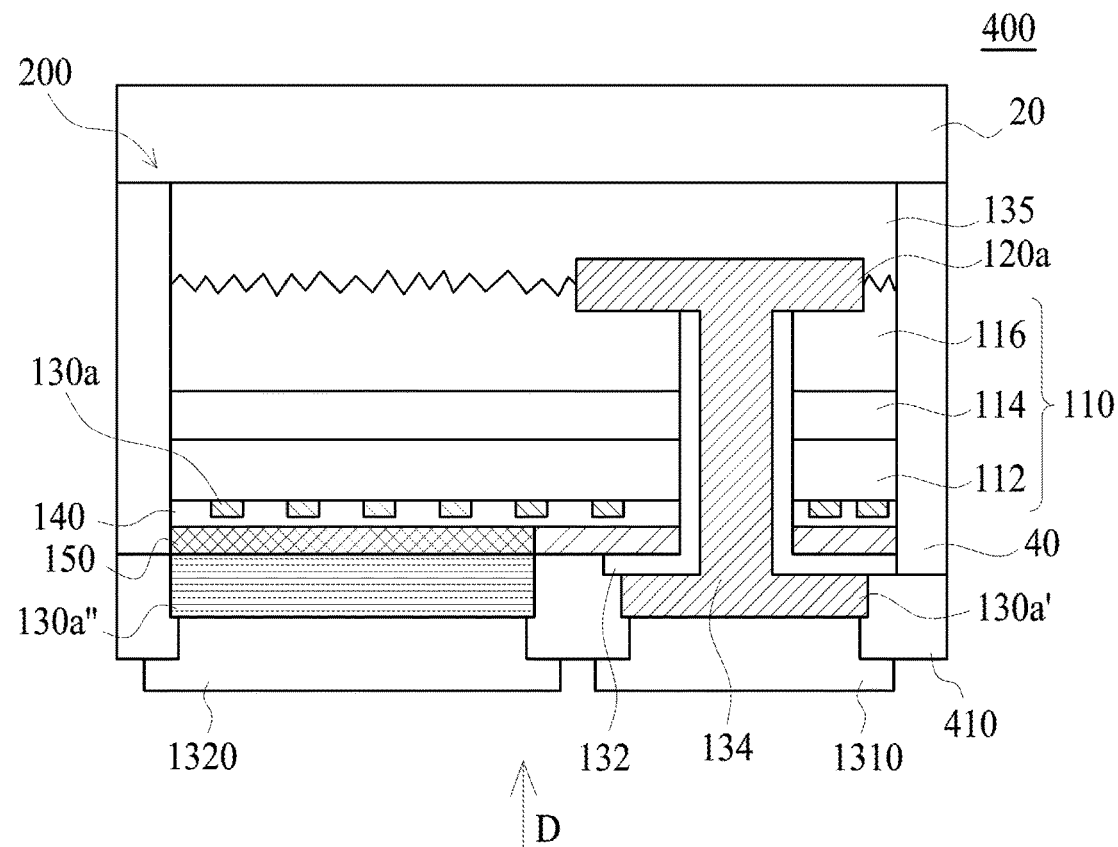
FIG. 6E shows a side view of the encapsulated semiconductor light-emitting device during the process in accordance with the fifth step of the third embodiment of the present application.

Finally, a p-type bonding pad 1310 and an n-type bonding pad 1320 are respectively formed in the openings 411, 412 above the transparent structure 40 and the insulative scattering layer 410 for wire bonding by chemical plating, electroplating, or sputtering with mask. After completing the above process, the encapsulated semiconductor light-emitting device 400 is completed as shown in FIG. 6E. Because the semiconductor epitaxial stack 110 is surrounded by encapsulating structure, the semiconductor light-emitting device 400 has better heat resistance, moisture resistance and oxidative stability. The semiconductor light-emitting device 400 is able to electrically connect to the printed circuit board by wire bonding or flip-chip bonding to form a light-emitting device, such as light bulb, back light unit, and vehicle lamp.

Figure 8:
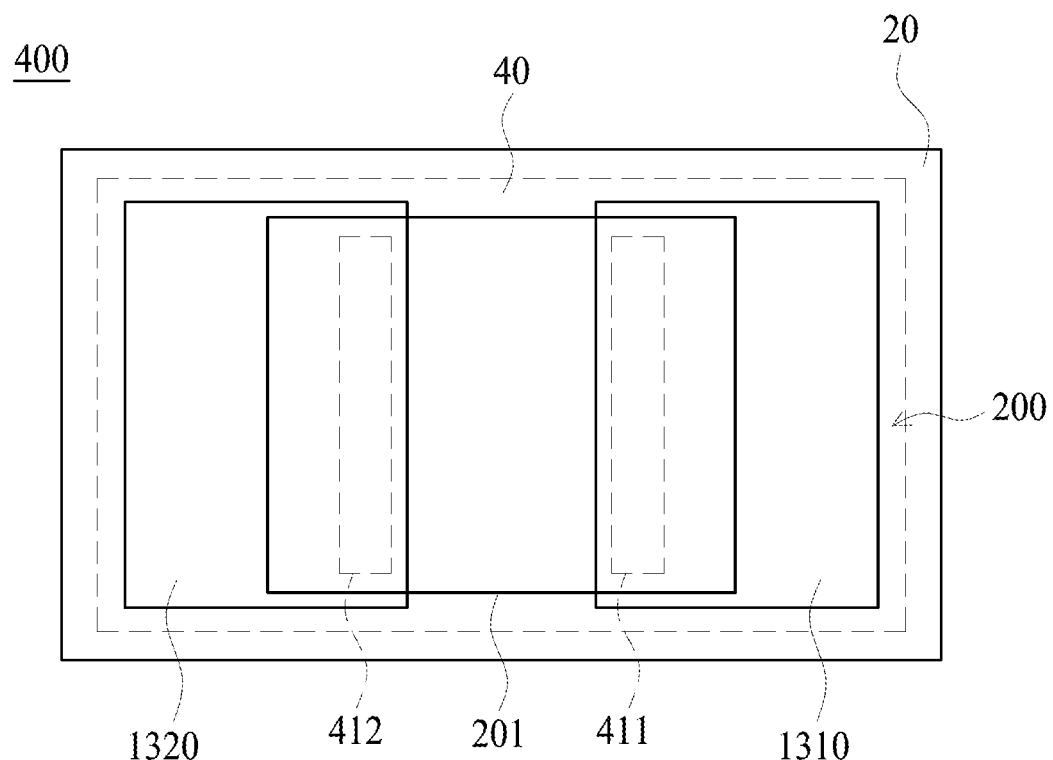
FIG. 8 shows a top view of the encapsulated semiconductor light-emitting device during the process in accordance with the fifth step of the third embodiment of the present application.

FIG. 8 shows a top view of the semiconductor light-emitting device 400. The view along the direction D (shown in FIG. 6E) perpendicular to the first support substrate 20 shows that the first epitaxial unit 201 of the semiconductor light-emitting device 200 is surrounded by the transparent structure 40, wherein and the transparent structure 40 is covered by an insulative scattering layer (not shown). A portion of the insulative scattering layer is removed to form the openings 411, 412 on the first epitaxial unit 201, wherein the openings 411, 412 are overlapped by the p-type bonding pad 1310 and the n-type bonding pad 1320 which electrically connect the first epitaxial unit 201. The p-type bonding pad 1310 and the n-type bonding pad 1320 are out of the range of the first epitaxial unit 201. Namely, the view along the direction perpendicular to the first support substrate 20 shows that a portion of the p-type bonding pad 1310 and a portion of the n-type bonding pad 1320 do not overlap with the first epitaxial unit 201.

The aforementioned structure is able to increase the area of the metal bonding pad. As the semiconductor light-emitting device 400 electrically connects the external substrate, such as printed circuit board, the connection between the devices is more reliable and more stable. In a preferable embodiment, the exposed surface of the p-type bonding pad 1310 and the exposed surface of the n-type bonding pad 1320 on the same side of the first epitaxial unit 201 are in the same high level.

The p-type bonding pad 1310 and the n-type bonding pad 1320 are used for inducing an external electrical current, and the material thereof comprises Cu, Sn, Au, Ni, Ti, Pb, Cu—Sn, Cu—Zn, Cu—Cd, Sn—Pb—Sb, Sn—Pb—Zn, Ni—Sn, Ni—Co, Au alloy, Au—Cu—Ni—Au, or the combination thereof.

Figure 9:
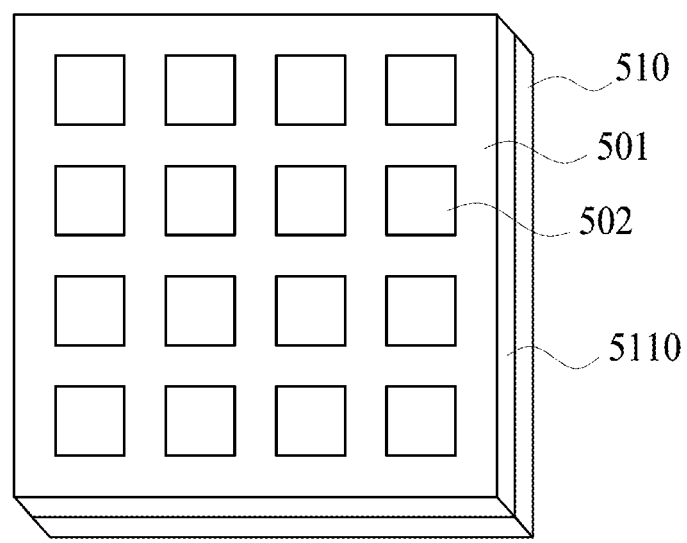
FIG. 9 shows a top view of the semiconductor light-emitting device during the process in accordance with the first step of the fourth embodiment of the present application.
Figure 10A:
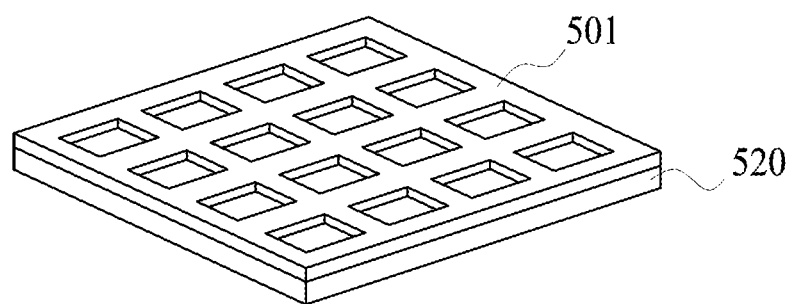
FIG. 10A shows an oblique side view of the semiconductor light-emitting device during the process in accordance with the second step of the fourth embodiment of the present application.
Figure 10B:
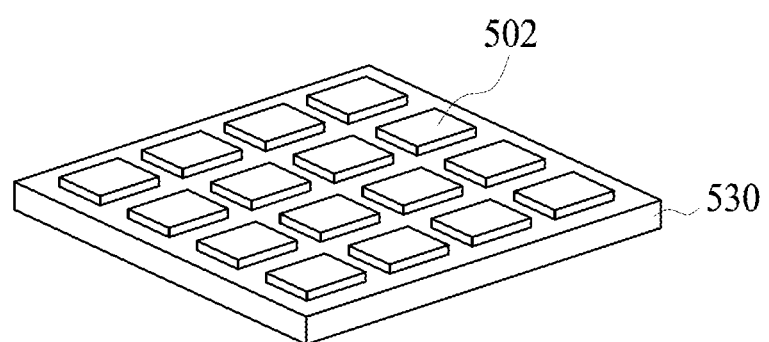
FIG. 10B shows an oblique side view of the semiconductor light-emitting device during the process in accordance with the second step of the fourth embodiment of the present application.

The view along the direction perpendicular to the substrate shows that the epitaxial unit can be formed to different shapes for meeting different demands. FIG. 9 shows that the epitaxial unit can be cut into square or cross disclosed in the embodiment. The semiconductor epitaxial stack 5110 on the growth substrate 510 is divided into a first epitaxial unit 501 and a second epitaxial unit 502, and then the first epitaxial unit 501 and the second epitaxial unit 502 are respectively transferred to the first support substrate 520 and the second support substrate 530 as shown in FIGS. 10A and 10B.

Because the material of the first support substrate 520 and the second support substrate 530 comprises insulative material, such as sapphire ($Al_2O_3$), an electrically conductive layer can fully contact the surface of the support substrate, or be patterned to partially contact the support substrate for electrically connecting the epitaxial units on the support substrate, wherein the electrically conductive layer is made of transparent metal oxide conductive layer which is pervious to the light emitted from the epitaxial units. The transparent metal oxide conductive layer can be made by CVD or PVD, and the material of the transparent metal oxide conductive layer comprises ITO, IZO, InO, SnO, FTO, ATO, CTO, AZO, GZO or the combination thereof. The transparent metal oxide conductive layer can also be used for the material of the adhesive layer and formed with the substrate transferring process as mentioned above.

Figure 11A:
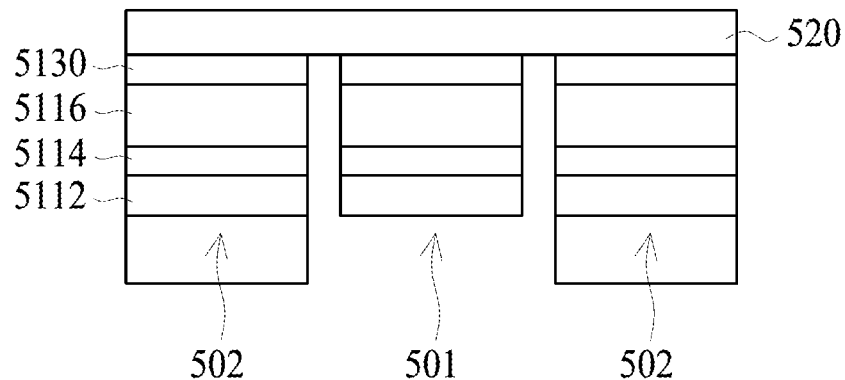
FIG. 11A shows a side view of the semiconductor light-emitting devices during the process in accordance with the first step of the fifth embodiment of the present application.

FIGS. 11A to 11E show a method of manufacturing a semiconductor light-emitting device by using a transparent metal oxide conductive layer as an adhesive material in accordance with another embodiment. As shown in FIG. 11A, a semiconductor epitaxial stack is transferred from the growth substrate 510 to a first support substrate 520 with a first adhesive layer 5130 on thereof by the above mentioned method or a conventional method. And then, the semiconductor epitaxial stack is patterned and divided into a first epitaxial unit 501 and a second epitaxial unit 502. The first adhesive layer 5130 comprises organic material, such as Acrylic acid, Unsaturated polyester, Epoxy, Oxetane, Vinyl ether, Nylon, PP, PBT, PPO, PC, ABS, and PVC; metal, such as Ti, Au, Be, W, Al, Ge, Cu, and the alloy thereof; oxide, such as ITO, CTO, ATO, IZO, AZO, ZTO, ZnO, and $SiO_x$; or nitride, such as $SiN_x$.

Figure 11B:
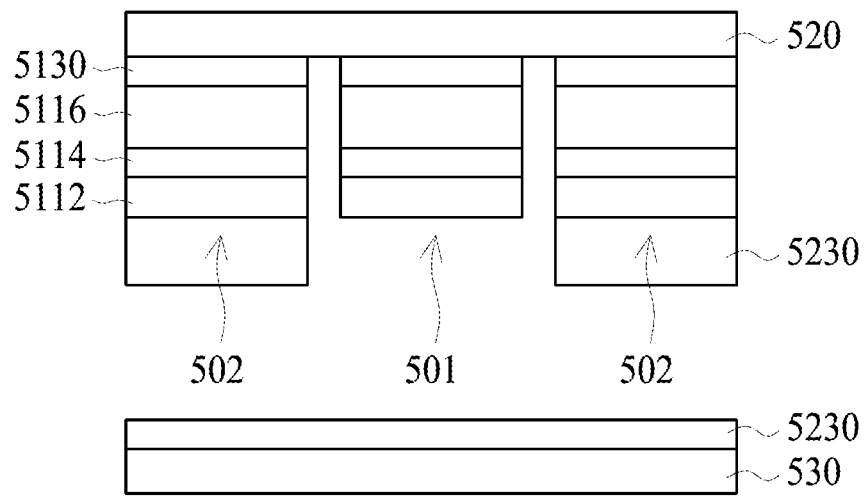
FIG. 11B shows a side view of the semiconductor light-emitting devices during the process in accordance with the second step of the fifth embodiment of the present application.
Figure 11C:
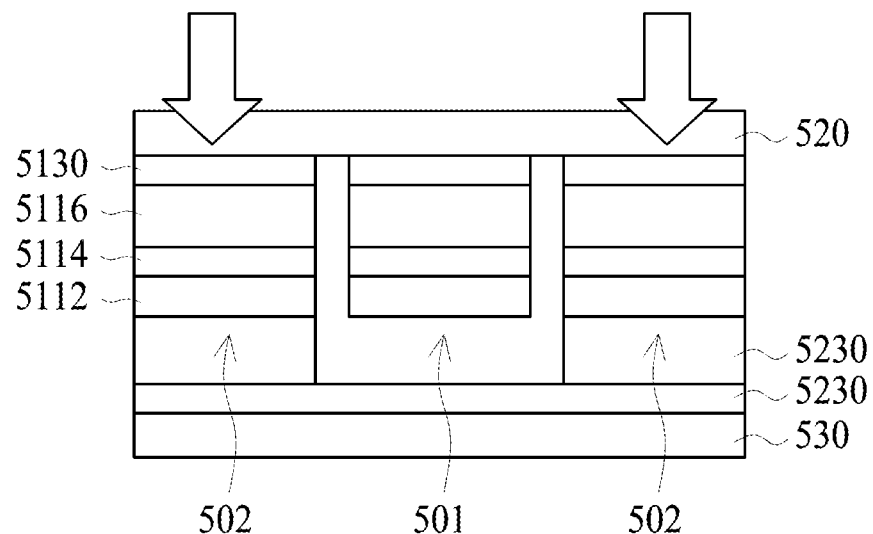
FIG. 11C shows a side view of the semiconductor light-emitting devices during the process in accordance with the third step of the fifth embodiment of the present application.
Figure 11D:
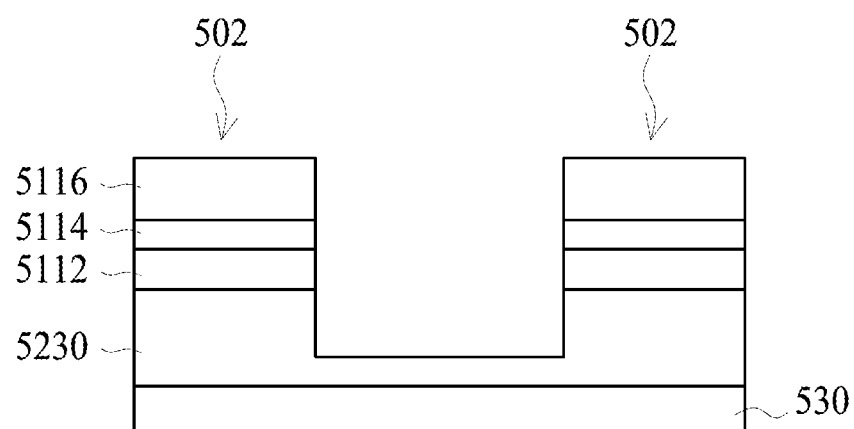
FIG. 11D shows a side view of the semiconductor light-emitting devices during the process in accordance with the fourth step of the fifth embodiment of the present application.

As FIGS. 11A and 11B show, a semiconductor epitaxial stack includes an n-type semiconductor layer 5112, an active layer 5114 and a p-type semiconductor layer 5116. As the aforementioned process, the semiconductor epitaxial stack is patterned and divided into a first epitaxial unit 501 and multiple second epitaxial units 502. Next, two second adhesive layers 5230 are respectively formed on the surface of each second epitaxial unit 502 and on the surface of a second support substrate 530, wherein the two second adhesive layers 5230 are made of the transparent metal oxide conductive layer. And then, the two second adhesive layers 5230 are connected by heating or pressing. The second adhesive layers 5230 can be formed on the full surface of the second support substrate 530 or patterned on the partial surface of the second support substrate 530. As shown in FIGS. 11C and 11D, the first adhesive layer 5130 between the first support substrate 520 and the second epitaxial units 502 can be melted by illuminating laser or UV, and then the second epitaxial units 502 are transferred to the second support substrate 530. After the second epitaxial units 502 are adhered to the second support substrate 530, the remaining first adhesive layer 5130 on the surface of the each second epitaxial unit 502 on the second support substrate 530 can be removed by dry or wet etching. Finally, the first epitaxial unit 501 and the multiple second epitaxial units 502 are respectively on the first support substrate 520 and the second support substrate 530 as shown in FIGS. 10A and 10B.

In the embodiment, the method to separate the first support substrate 520 and the second epitaxial units 502 includes melting the first adhesive layer 5130 by illuminating laser as mentioned above. Alternatively, a material with low adhesion force with the first support substrate 520, such as $SiO_2$, is used as the first adhesive layer 5130 so a mechanical force can be applied to separate the first support substrate 520 and the second epitaxial units 502 after the second epitaxial units 502 are adhered to the second support substrate 530 by forming a patterned second adhesive layer 5230 on the surfaces of the second epitaxial units 502 which are chosen to be transferred again.

After the second epitaxial units 502 and the first support substrate 520 are separated, the second support substrate 530 has the second epitaxial units 502 thereon which are transferred again. Next, the second support substrate 530 can be patterned and divided into multiple second support substrate units (not shown) for forming light-emitting devices, wherein each of the second support substrate units has one or multiple second epitaxial units 502 thereon.

Figure 11E:
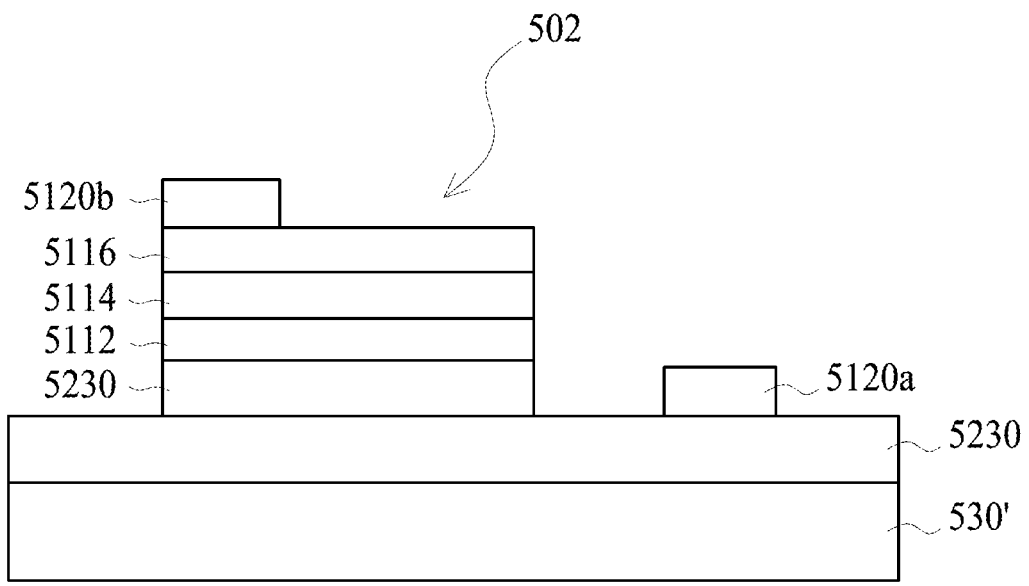
FIG. 11E shows a side view of the semiconductor light-emitting devices during the process in accordance with the fifth step of the fifth embodiment of the present application.

FIG. 11E shows that a single second support substrate unit 530' supports one second epitaxial unit 502 thereon. Because the patterned second adhesive layer 5230 is made of transparent metal oxide conductive layer, the patterned second adhesive layer 5230 is able to electrically connect the n-type semiconductor layer 5112 and extend to the surface of the second support substrate unit 530' beyond the second epitaxial unit 502. Next, an n-side electrode 5120a and a p-side electrode 5120b are respectively patterned on the surface of the second support substrate unit 530' beyond the second epitaxial unit 502 and on the surface of the p-type semiconductor layer 5116 by lithography process with sputtering, thermal deposition, or electroplating. The n-side electrode 5120a produced by the aforementioned process is not on the surface of the second epitaxial unit 502 for avoiding shading the light and increasing the light extracting efficiency.

After the patterned second epitaxial units 502 are transferred to form the different semiconductor devices, the first epitaxial unit 501, which remains on the first support substrate 520, can be divided from the first support substrate 520 to form different semiconductor devices by subsequent different processes.

Figure 13:
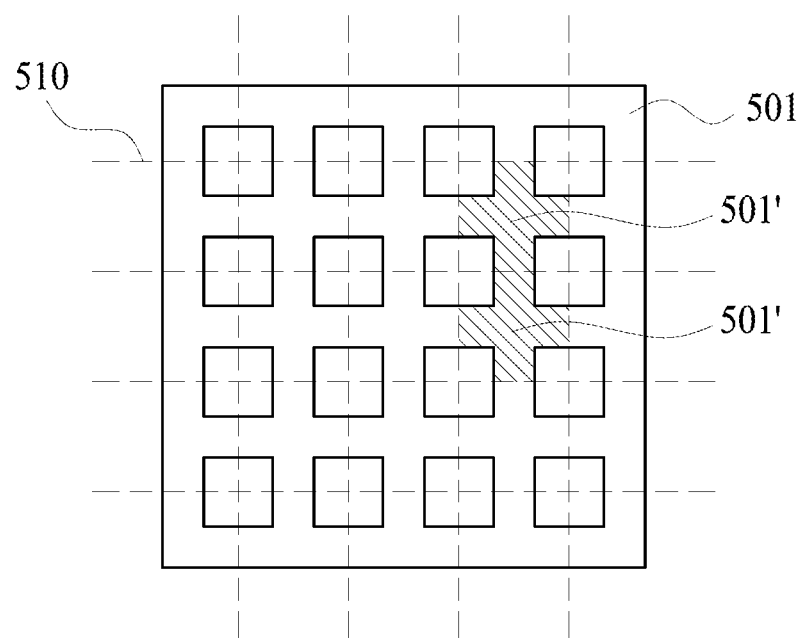
FIG. 13 shows an oblique side view of the semiconductor light-emitting device in accordance with the first step of the fourth embodiment of the present application.

FIG. 13 shows that the remaining first epitaxial unit 501 can further form multiple semiconductor light-emitting devices with cross-shaped epitaxial units 501' represented by the dotted line 510 by the cutting method disclosed in the embodiments. As FIGS. 14A to 14D indicate, the process disclosed in the embodiment can efficiently utilize the entire semiconductor epitaxial stack on the substrate.

Figure 14A:
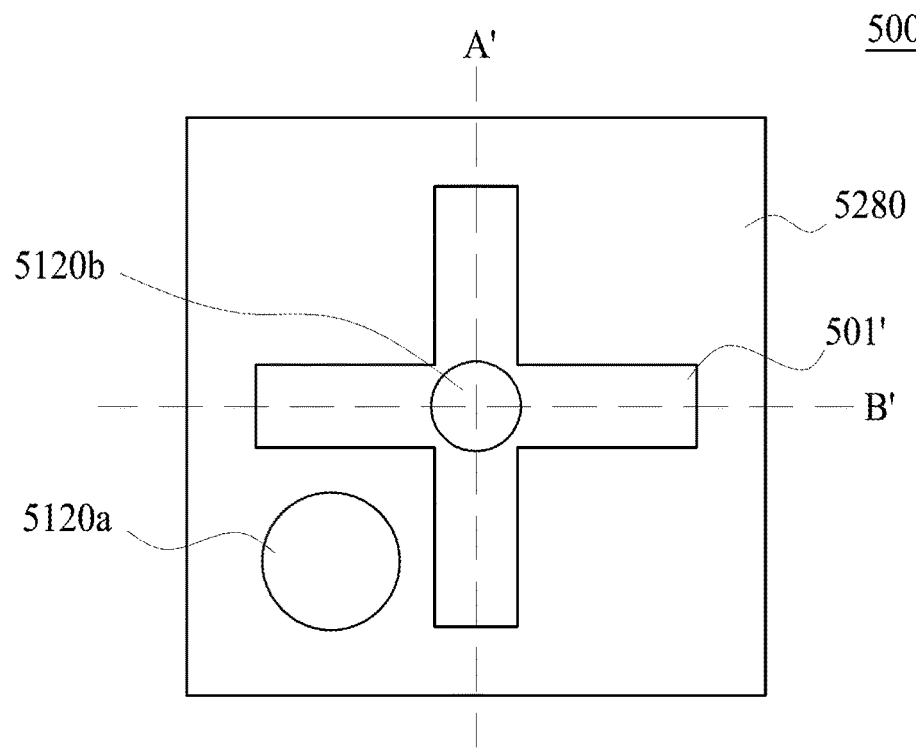
FIG. 14A shows a top view of the semiconductor light-emitting device in accordance with the fourth embodiment of the present application.
Figure 14B:
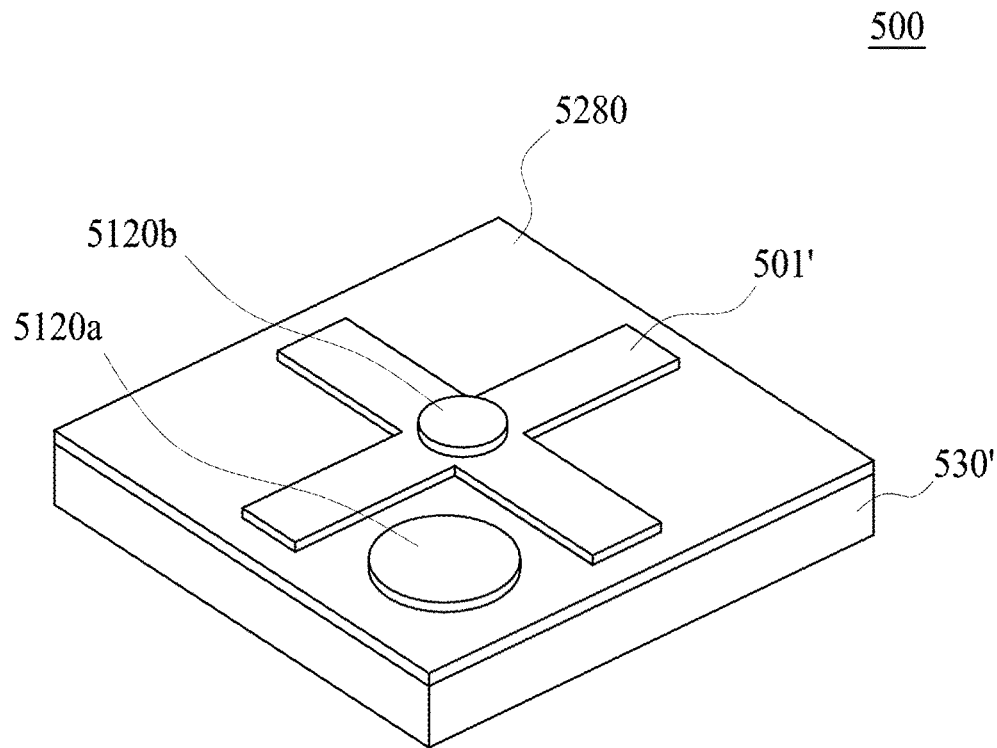
FIG. 14B shows an oblique side view of the semiconductor light-emitting device in accordance with the fourth embodiment of the present application.

The top views and oblique side views of different appearances in accordance with the aforementioned embodiment are described in the following description. FIG. 14A shows a top view of the semiconductor light-emitting device 500 comprising the cross epitaxial unit 501', and FIG. 14B shows an oblique side view thereof. In the embodiment, as shown in FIG. 14A, a transparent metal oxide conductive layer 5280 is formed on the whole top surface of the second support substrate unit 530', and the patterned n-side electrode 5120a and the p-side electrode 5120b are respectively formed on the surface of the transparent metal oxide conductive layer 5280 extending out from the second epitaxial unit 502 and on the surface of the p-type semiconductor layer 5116, wherein the patterned n-side electrode 5120a and the p-side electrode 5120b respectively and electrically contact the n-type semiconductor layer 5112 and the p-type semiconductor layer 5116.

Figure 14C:
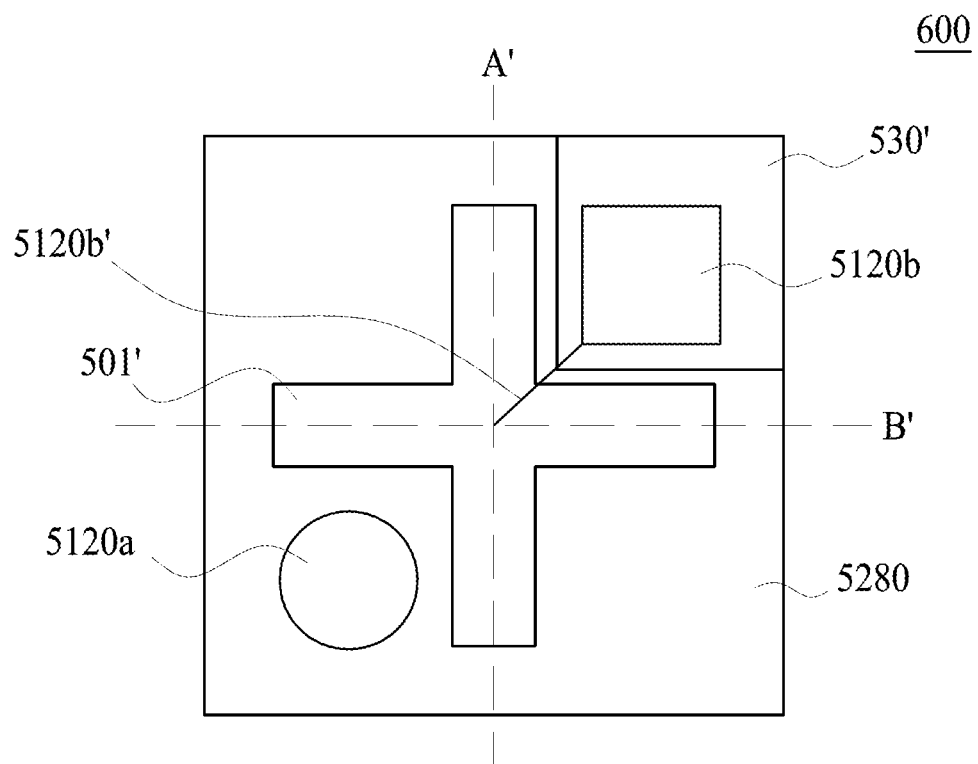
FIG. 14C shows a top view of the other type semiconductor light-emitting device in accordance with the fourth embodiment of the present application.
Figure 14D:
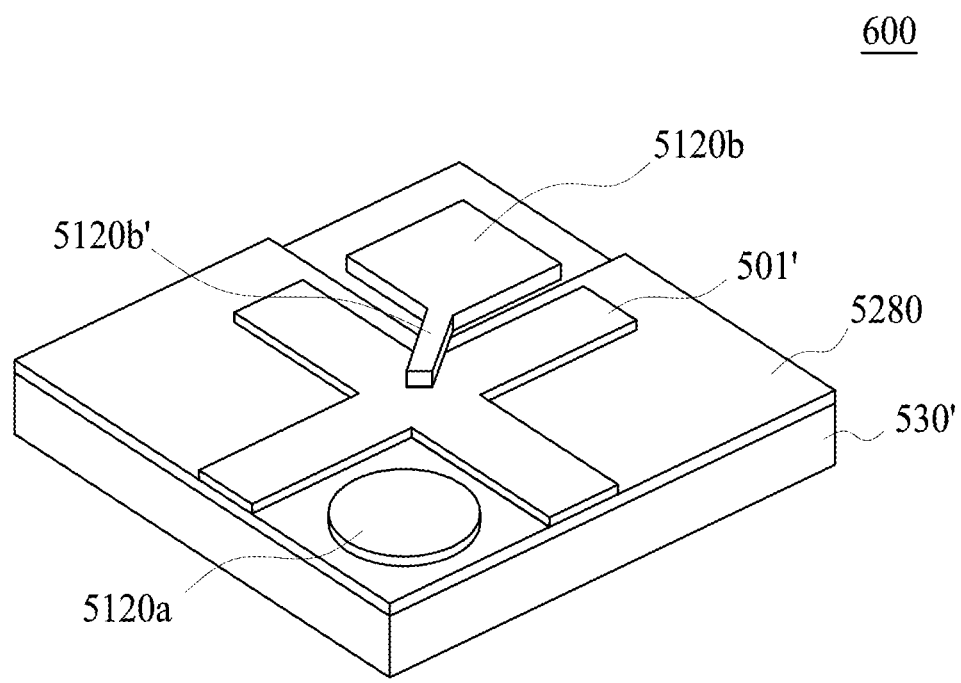
FIG. 14D shows an oblique side view of the other type semiconductor light-emitting device in accordance with the fourth embodiment of the present application.

FIGS. 14C and 14D respectively show a top view and an oblique side view of the semiconductor light-emitting device 600 comprising the cross epitaxial unit 501' in accordance with another embodiment. In the embodiment, the partially patterned transparent metal oxide conductive layer 5280, which is used as an adhesion layer, is disposed on the surface of the second support substrate unit 530', wherein the second support substrate unit 530' is an insulative substrate, such as sapphire ($Al_2O_3$). Then, the p-side electrode 5120b is disposed on the region of the surface of the second support substrate unit 530' not covered by the transparent metal oxide conductive layer 5280, and a p-type extension 5120b', which extends from the p-side electrode 5120b, electrically contacts the p-type semiconductor layer 5116. The patterned n-side electrode 5120a is disposed on the surface of the patterned second adhesive layer 5230 beyond the second epitaxial unit 502 and electrically contacts the n-type semiconductor layer 5112 through the patterned second adhesive layer 5230. By the design, both of the patterned n-side electrode 5120a and the p-side electrode 5120b are not on the surface of the second epitaxial unit 502 for reducing the light shaded by the opaque metal material and for increasing the light extraction.

As FIGS. 14A and 14C respectively show the top views of the semiconductor light-emitting devices 500, 600, the cross epitaxial unit 501' is made from the first epitaxial unit 501, which has symmetrical shape and has two different symmetrical surfaces A' and B' perpendicular to the substrate, and the end portions of the cross epitaxial unit 501' are near the edges of the second support substrate unit 530'. Therefore, the portion of the second support substrate unit 530' uncovered by the cross epitaxial unit 501' can be partitioned into four regions. In another embodiment, the first epitaxial unit 501 can be made to L-shape epitaxial units or irregular polygon epitaxial units, and the second support substrate unit 530' can also be partitioned into multiple regions, not limited to 4 regions.

In the embodiment, the second support substrate 530 is an insulative substrate, such as sapphire ($Al_2O_3$) substrate, aluminum nitride (AlN) substrate, glass substrate, and organic polymer substrate. And, the second support substrate 530 can also be an electrically conductive substrate, such as lithium aluminum oxide ($LiAlO_2$) substrate, zinc oxide (ZnO) substrate and gallium nitride (GaP) substrate. And, the second support substrate 530 can be a transparent substrate or a reflective substrate. Besides, the material of the second support substrate 530 can also be made of a high thermal dissipation material with a thermal conductivity coefficient larger than 24 W/m*k, such as Cu, Wu, AlN, Metal Matrix Composite (MMC), Ceramic Matrix Composite (CMC), SiC, Al, Si, Diamond, or the combination thereof.

Figure 12A:
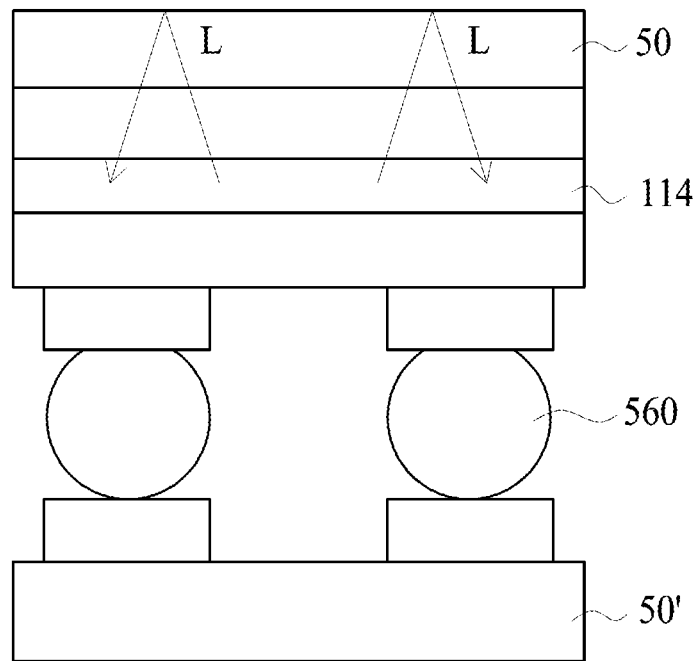
FIG. 12A shows a side view of the conventional flip-chip type semiconductor light-emitting device.
Figure 12B:
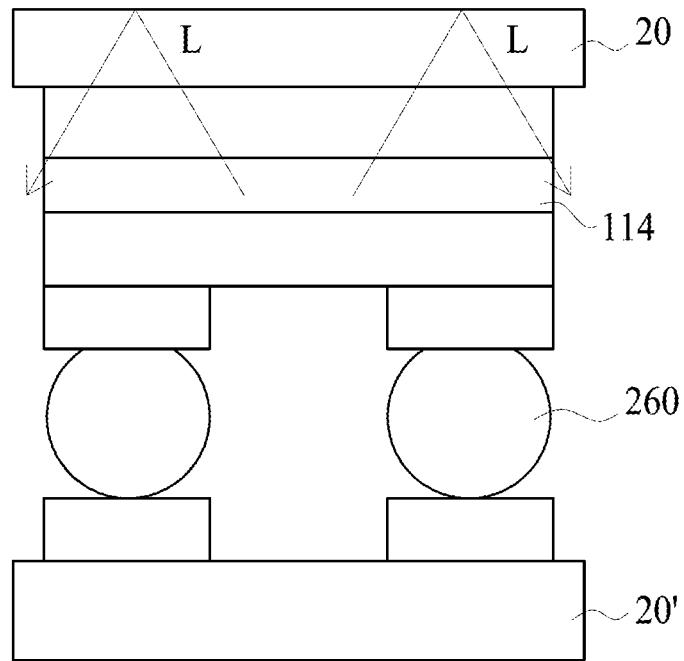
FIG. 12B shows a side view of the flip-chip type semiconductor light-emitting device in accordance with the first embodiment of the present application.

Besides, for the aforementioned semiconductor light-emitting devices 200, 300, the area of each of the transparent support substrates (20, 30) is larger than the area of the surface of the active layer 114 of the semiconductor epitaxial stack 110. While the light enters the transparent support substrates (20, 30) of which the refractivity is lower than the refractivity of the semiconductor epitaxial stack 110, since the transparent support substrates (20, 30) have larger area, more light can depart from the transparent support substrates (20, 30). As shown in FIGS. 12A and 12B, for the conventional flip-chip type light-emitting devices, the conventional flip-chip type light-emitting device and the active layer 114 thereof have the same areas. For the flip-chip type semiconductor light-emitting device 200 disclosed in the aforementioned embodiment, the area of the first support substrate 20 of the flip-chip type semiconductor light-emitting device 200 (shown in FIG. 3C) is larger than twice the area of the surface of the active layer 114 thereof, which is different from the conventional flip-chip type light-emitting devices. The light-emitting devices 5000, 2000 are respectively formed by respectively connecting the light-emitting diodes to the corresponding circuits of the submounts 50', 20' through the tin solders 560, 260. In the meantime, there is more light L emitted from the active layer 114 which can be extracted from large support substrate 20 and not be absorbed again by the active layer 114. Thus, the light-emitting device 2000 has better light extracting efficiency than the light-emitting device 5000. Namely, as the large support substrate 20 is applied to the high-voltage semiconductor light-emitting device 300, the encapsulated semiconductor light-emitting device 400, or the semiconductor light-emitting devices 500, 600 made from the single second epitaxial units 502, the light extracting efficiencies thereof can also be improved.

In different embodiment, the number of the semiconductor epitaxial stack(s) on a single support substrate is not limited to one. In order to simplify the process, after a semiconductor epitaxial stack is formed on a larger first support substrate 20, multiple the same first epitaxial units 201 and second epitaxial units 202 as shown in FIG. 7 can be formed by lithography process and transferring process. Next, the multiple second epitaxial units 202 formed on the first support substrate 20 are transferred to the larger second support substrate 30 (such as a wafer) at the same time, and the first epitaxial units 201 remain on the first support substrate 20. Next, after the first support substrate 20 and the second support substrate 30 are processed by aforementioned process, the multiple semiconductor light-emitting devices 200 comprising the first epitaxial units 201, of which the size is the same as the size of the substrate shown in FIG. 3C, can be formed by cutting the first support substrate 20; and similarly, the multiple semiconductor light-emitting devices 300 comprising the third epitaxial units 202', of which the size is the same as the size of the substrate shown in FIG. 4C, can be formed by cutting the second support substrate 30.

One of the semiconductor light-emitting devices 200 matches one of the semiconductor light-emitting devices 300, and one unit of a single semiconductor epitaxial stack 110 on a single substrate can form one semiconductor light-emitting devices 200 and one semiconductor light-emitting devices 300. Therefore, the semiconductor light-emitting devices 200, 300 should have approximately the same sizes. In other words, the areas of the substrates thereof are approximately the same as shown in FIGS. 3C and 4C.

Although the present application has been explained above, it is not the limitation of the range, the sequence in practice, the material in practice, or the method in practice. Any modification or decoration for present application is not detached from the spirit and the range of such.

REFERENCE SIGNS

Growth substrate 10, 210, 510;
n-type semiconductor layer 112, 2112, 5112;
Active layer 114, 2114, 5114;
p-type semiconductor layer 116, 2116, 5116;
Semiconductor epitaxial stack 110, 2110, 5110;
p-side electrode 120a, 120b, 2120a, 2120b, 5120b;
First support substrate 20, 220, 520, 60;
First adhesive layer 135, 2135, 5130;
n-side electrode 130a, 130b, 2130a, 2130b, 130b', 5120a;
Metal oxide transparent conductive layer 140, 2140;
Reflective layer 150, 2150;
First epitaxial unit 201, 2201, 501;
Second epitaxial unit 202, 2202, 502, 501';
Second adhesive layer 230, 2230, 5230;
Transparent metal oxide conductive layer 5280;
Second support substrate 30, 530;
Semiconductor light-emitting device 200, 300, 400, 500, 600;
Patterned sacrificial layer 2123;
p-type extension 130a', 5120b';
n-type extension 130a";
Conductive through hole 134;
Insulative layer 132, 232;
Third epitaxial unit 202';
Metal conductive connection structure 125;
p-type bonding pad 120b', 1310;
n-type bonding pad 120b", 1320;
Transparent structure 40;
Insulative scattering layer 410;
Opening 411, 412;
Second support substrate unit 530';
Cross epitaxial unit 501';
Tin solder 260, 560;
submount 50', 20';
light-emitting device 5000, 2000;
Symmetrical surface A', B';
direction D.

What is claimed is:

1. A method of forming a semiconductor light-emitting device, comprising:
adhering a plurality of first epitaxial units and a plurality of second epitaxial units to a first substrate through a first adhesive layer;
adhering a second substrate to the second epitaxial units;
transferring the second epitaxial units to the second substrate by removing a portion of the first adhesive layer between the second epitaxial units and the first substrate,
wherein the first epitaxial units remaining on the first substrate and the second epitaxial units transferred to the second substrate have different quantities.

2. The method of claim 1, wherein, in a top view, the first epitaxial units collectively have a first total area, the second epitaxial units collectively have a second total area, the first total area and the second total area are different from each other.

3. The method of claim 2, wherein, in the top view, the plurality of first epitaxial units comprises a plurality of first active layers which collectively has a third total area, the plurality of second epitaxial units comprises a plurality of second active layers which collectively has a fourth total area, the third total area and the fourth total area are different from each other.

4. The method of claim 1, wherein at least one of the first epitaxial units and at least one of the second epitaxial units have same heights.

5. The method of claim 1, further comprising a step of forming a plurality of electrodes on the plurality of first epitaxial units and the plurality of second epitaxial units.

6. The method of claim 5, wherein, before the removing step, the plurality of electrodes formed on at least one of the first epitaxial units and at least one of the second epitaxial units is arranged to separate from the first substrate by a same distance.

7. The method of claim 1, wherein, before the removing step, at least one of the second epitaxial units is arranged between two of the first epitaxial units.

8. The method of claim 1, wherein, before the removing step, the plurality of first epitaxial units and the plurality of second epitaxial units are interdigitated with each other on the first substrate.

9. The method of claim 1, wherein, the step of removing the portion of the first adhesive layer comprises a step of providing a laser to dissolve the portion of the first adhesive layer between at least one of the second epitaxial units and the first substrate.

10. The method of claim 1, wherein each of the first epitaxial unit has a surface facing the first substrate and the first adhesive layer directly contacts the surface.

11. The method of claim 1, further comprising a step of forming a second adhesive layer to adhere the second substrate to the second epitaxial unit.

12. The method of claim 11, wherein the second adhesive layer is corresponding to the position of the second epitaxial unit.

13. The method according to claim 1, wherein the method of adhering the second substrate to the second epitaxial unit comprises heating or pressing.

14. A method of forming a semiconductor light-emitting device, comprising:
   providing a temporary structure comprising a first substrate, a second substrate and a plurality of epitaxial units entirely adhered to the first substrate and partially adhered to the second substrate;
   separating the plurality of epitaxial units adhered to the second substrate from the first substrate;
   wherein the plurality of epitaxial units adhered to the first substrate and the plurality of epitaxial units adhered to the second substrate have different quantities.

15. The method of claim 14, wherein, in a top view, the plurality of epitaxial units on the first substrate occupies larger area than the plurality of epitaxial units on the second substrate.

16. The method of claim 14, wherein, in a top view, the plurality of epitaxial units on the first substrate collectively provide larger light emitting area than the plurality of epitaxial units on the second substrate.

17. The method of claim 14, wherein the plurality of epitaxial units has a same height.

18. The method of claim 14, wherein, before the separation step, one of the epitaxial units determined to be separated is between two of the remained epitaxial units.

19. The method of claim 14, wherein, before the separation step, the second epitaxial unit neighbors two neighboring first epitaxial units, and the second epitaxial unit is closer to one of two neighboring first epitaxial unit.

\* \* \* \* \*